(12) United States Patent
D'Evelyn et al.

(10) Patent No.: US 10,145,026 B2
(45) Date of Patent: Dec. 4, 2018

(54) PROCESS FOR LARGE-SCALE AMMONOTHERMAL MANUFACTURING OF SEMIPOLAR GALLIUM NITRIDE BOULES

(71) Applicant: SLT TECHNOLOGIES, INC., Los Angeles, CA (US)

(72) Inventors: Mark P. D'Evelyn, Santa Barbara, CA (US); Dirk Ehrentraut, Santa Barbara, CA (US); Derrick S. Kamber, Santa Barbara, CA (US); Bradley C. Downey, Santa Barbara, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 602 days.

(21) Appl. No.: 13/908,836

(22) Filed: Jun. 3, 2013

(65) Prior Publication Data
US 2013/0323490 A1    Dec. 5, 2013

Related U.S. Application Data

(60) Provisional application No. 61/655,172, filed on Jun. 4, 2012.

(51) Int. Cl.
C30B 29/40    (2006.01)
C30B 7/10    (2006.01)

(52) U.S. Cl.
CPC ............ *C30B 29/406* (2013.01); *C30B 7/105* (2013.01)

(58) Field of Classification Search
CPC ................ C30B 29/406; C30B 7/105
See application file for complete search history.

(56) References Cited

U.S. PATENT DOCUMENTS

| | | | |
|---|---|---|---|
| 4,030,966 A | 6/1977 | Hornig et al. |
| 4,066,868 A | 1/1978 | Witkin et al. |
| 4,350,560 A | 9/1982 | Helgeland et al. |
| 5,098,673 A | 3/1992 | Engel et al. |
| 5,169,486 A | 12/1992 | Young et al. |
| 5,813,753 A | 9/1998 | Vriens et al. |
| 6,129,900 A | 10/2000 | Satoh et al. |

(Continued)

FOREIGN PATENT DOCUMENTS

| | | |
|---|---|---|
| CN | 101061570 | 10/2007 |
| EP | 2381490 | 10/2011 |

(Continued)

OTHER PUBLICATIONS

Khoury et al., Growth of semipolar (2021) GaN layers on patterned silicon (114) 11 off by Metal Organic Vapor Phase Epitaxy), Journal of Crystal growth, vol. 419, 2015, pp. 88-93.*

(Continued)

*Primary Examiner* — Jonathan C Langman
(74) *Attorney, Agent, or Firm* — Patterson & Sheridan, LLP

(57) ABSTRACT

Methods for large-scale manufacturing of semipolar gallium nitride boules are disclosed. The disclosed methods comprise suspending large-area single crystal seed plates in a rack, placing the rack in a large diameter autoclave or internally-heated high pressure apparatus along with ammonia and a mineralizer, and growing crystals ammonothermally. A bi-faceted growth morphology may be maintained to facilitate fabrication of large area semipolar wafers without growing thick boules.

21 Claims, 21 Drawing Sheets

(56) References Cited

U.S. PATENT DOCUMENTS

| | | |
|---|---|---|
| 6,273,948 B1 | 8/2001 | Porowski et al. |
| 6,398,867 B1 | 6/2002 | D'Evelyn et al. |
| 6,406,540 B1 | 6/2002 | Harris et al. |
| 6,528,427 B2 | 3/2003 | Chebi et al. |
| 6,596,079 B1 | 7/2003 | Vaudo et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,252,712 B2 | 8/2007 | Dwilinski et al. |
| 7,279,040 B1 | 10/2007 | Wang |
| 7,316,746 B2 | 1/2008 | D'Evelyn et al. |
| 7,335,262 B2 | 2/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,858,408 B2 | 12/2010 | Mueller et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,062,726 B2 | 11/2011 | Greiner et al. |
| 8,097,081 B2 | 1/2012 | D'Evelyn |
| 8,148,801 B2 | 4/2012 | D'Evelyn |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,476,644 B2 | 7/2013 | Illek et al. |
| 8,482,104 B2 | 7/2013 | D'Evelyn et al. |
| 8,492,185 B1 | 7/2013 | D'Evelyn et al. |
| 2001/0011935 A1 | 8/2001 | Lee et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0135136 A1 | 7/2004 | Takahashi et al. |
| 2005/0024744 A1 | 2/2005 | Falicoff et al. |
| 2005/0087753 A1 | 4/2005 | D'Evelyn et al. |
| 2005/0098095 A1* | 5/2005 | D'Evelyn et al. ............ 117/105 |
| 2005/0128469 A1 | 6/2005 | Hall et al. |
| 2005/0152820 A1 | 7/2005 | D'Evelyn et al. |
| 2005/0205215 A1 | 9/2005 | Giddings et al. |
| 2005/0225988 A1 | 10/2005 | Chaves et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0096521 A1 | 5/2006 | D'Evelyn et al. |
| 2006/0105485 A1 | 5/2006 | Basin et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0226759 A1 | 10/2006 | Masuda et al. |
| 2006/0288927 A1 | 12/2006 | Chodelka et al. |
| 2007/0057337 A1 | 3/2007 | Kano et al. |
| 2007/0105351 A1 | 5/2007 | Motoki et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0252164 A1 | 11/2007 | Zhong et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0156254 A1 | 7/2008 | Dwilinski et al. |
| 2008/0193363 A1 | 8/2008 | Tsuji |
| 2009/0092536 A1 | 4/2009 | Kawabata et al. |
| 2009/0146170 A1 | 6/2009 | Zhong et al. |
| 2009/0206354 A1 | 8/2009 | Kitano et al. |
| 2009/0218593 A1 | 9/2009 | Kamikawa et al. |
| 2009/0250686 A1 | 10/2009 | Sato et al. |
| 2009/0262516 A1 | 10/2009 | Li |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320745 A1 | 12/2009 | D'Evelyn et al. |
| 2010/0001300 A1 | 1/2010 | Raring et al. |
| 2010/0003492 A1* | 1/2010 | D'Evelyn ............... 428/220 |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0226399 A1 | 9/2010 | Nishinaka |
| 2011/0001157 A1 | 1/2011 | McKenzie et al. |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0183498 A1 | 7/2011 | D'Evelyn |
| 2011/0220912 A1 | 9/2011 | D'Evelyn |
| 2011/0223701 A1 | 9/2011 | Kyono et al. |
| 2011/0256693 A1 | 10/2011 | D'Evelyn et al. |
| 2011/0260188 A1 | 10/2011 | Choi et al. |
| 2011/0266552 A1 | 11/2011 | Tu et al. |
| 2012/0000415 A1 | 1/2012 | D'Evelyn et al. |
| 2012/0012856 A1 | 1/2012 | Chen et al. |
| 2012/0086022 A1 | 4/2012 | Veerasamy et al. |
| 2012/0086023 A1 | 4/2012 | Veerasamy et al. |
| 2012/0088319 A1 | 4/2012 | Veerasamy et al. |

(56) References Cited

U.S. PATENT DOCUMENTS

| | | |
|---|---|---|
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0292649 A1 | 11/2012 | Sugiyama et al. |
| 2012/0299051 A1 | 11/2012 | Jeong |
| 2013/0119401 A1 | 5/2013 | D'Evelyn et al. |
| 2013/0207148 A1 | 8/2013 | Krauter et al. |
| 2013/0234108 A1 | 9/2013 | David et al. |
| 2013/0251615 A1 | 9/2013 | D'Evelyn et al. |
| 2014/0065360 A1 | 3/2014 | D'Evelyn et al. |
| 2014/0175492 A1 | 6/2014 | Steranka et al. |

FOREIGN PATENT DOCUMENTS

| | | |
|---|---|---|
| JP | 06-334215 | 12/1994 |
| JP | 2002-161000 | 6/2002 |
| JP | 2004-179644 | 6/2004 |
| JP | 2004-533391 | 11/2004 |
| JP | 2005-289797 | 10/2005 |
| JP | 2007-331973 | 12/2007 |
| JP | 2008-501600 | 1/2008 |
| JP | 2008-084973 | 4/2008 |
| JP | 2008-521737 | 6/2008 |
| JP | 2008-263154 | 10/2008 |
| JP | 2009-267164 | 11/2009 |
| JP | 2010-098068 | 4/2010 |
| JP | 2010-212493 | 9/2010 |
| JP | 2010-226110 | 10/2010 |
| JP | 2010-263128 | 11/2010 |
| JP | 2011-051863 | 3/2011 |
| JP | 2011-068503 | 4/2011 |
| JP | 2011-077325 | 4/2011 |
| JP | 2011-148655 | 8/2011 |
| JP | 2011-219304 | 11/2011 |
| JP | 2011-230998 | 11/2011 |
| JP | 2011-243963 | 12/2011 |
| JP | 2012-001432 | 1/2012 |
| JP | 2012-512119 | 5/2012 |
| WO | WO 2006/057463 | 1/2006 |
| WO | WO 2006/038467 | 4/2006 |
| WO | WO 2006/062880 | 6/2006 |
| WO | WO 2007/004495 | 1/2007 |
| WO | WO 2010/068916 | 6/2010 |
| WO | WO 2011/097393 | 8/2011 |
| WO | WO 2012/016033 | 2/2012 |
| WO | WO 2012/022813 | 2/2012 |
| WO | WO 2012/024636 | 2/2012 |

OTHER PUBLICATIONS

USPTO Office Action for U.S. Appl. No. 13/472,356 dated Dec. 9, 2013 (11 pages).
International Search Report & Written Opinion of PCT Application No. PCT/US2013/029453, dated Jul. 25, 2013, 11 pages total.
Communication from the Chinese Patent Office re 200980134876.2 dated Mar. 6, 2014, (10 pages).
Communication from the Japanese Patent Office re 2011-522191 dated Mar. 28, 2014, (6 pages).
Communication from the Korean Patent Office re 10-2012-7009980 dated Apr. 15, 2013, (6 pages).
USPTO Office Action for U.S. Appl. No. 13/472,356 dated Jun. 5, 2014 (12 pages).
Altoukhov et al., 'High reflectivity airgap distributed Bragg reflectors realized by wet etching of AlInN sacrificial layers', Applied Physics Letters, vol. 95, 2009, pp. 191102-1-191102-3.
Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Choi et al., '2.51 microcavity InGaN light-emitting diodes fabricated by a selective dry-etch thinning process', Applied Physics Letters, 2007, 91(6), 061120.
Copel et al., 'Surfactants in Epitaxial Growth', Physical Review Letters, Aug. 7, 1989, vol. 63, No. 6, p. 632-635.
D'Evelyn et al., 'Bulk GaN Crystal Growth by the High-Pressure Ammonothermal Method', Journal of Crystal Growth, vol. 300, 2007, pp. 11-16.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of Bulk GaN Crystals and Nonpolar/Semipolar Substrates by HVPE', MRS Bulletin, May 2009, vol. 34, No. 5, pp. 313-317.
Fukuda et al., 'Prospects for the Ammonothermal Growth of Large GaN Crystal', Journal of Crystal Growth, vol. 305, 2007, pp. 304-310.
Gladkov et al., 'Effect of Fe doping on optical properties of freestanding semi-insulating HVPE GaN:Fe', Journal of Crystal Growth, 2010, 312, pp. 1205-1209.
Grzegory, 'High pressure growth of bulk GaN from Solutions in gallium', Journal of Physics Condensed Matter, vol. 13, 2001, pp. 6875-6892.
Lide et al., 'Thermal Conductivity of Ceramics and Other Insulating Materials', CRC Handbook of Chemistry and Physics, 91st Edition, 2010-2011, pp. 12-203 and 12-204.
Lu et al., 'Structure of the Cl-passivated GaAs(111) surface', Physical Review B, Nov. 15, 1998, vol. 58, No. 20, pp. 13820-13823.
Massies et al., 'Surfactant mediated epitaxial growth of InxGa1—xAs on GaAs (001)', Applied Physics Letters, vol. 61, No. 1, Jul. 6, 1992, pp. 99-101.
http://www.matbase.com/material/non-ferrous-metals/other/molybdenum/properties, Data Table for: Non-Ferrous Metals: Other Metals: Molybdenum, Mar. 28, 2011, pp. 1.
Moutanabbir, 'Bulk GaN Ion Cleaving', Journal of Electronic Materials, vol. 39, 2010, pp. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report & Written Opinion of PCT Application No. PCT/US2009/067745, dated Feb. 5, 2010, 9 pages total.
Porowski, 'High Resistivity GaN Single Crystalline Substrates', Acta Physica Polonica A, vol. 92, No. 2, 1997, pp. 958-962.
Porowski, 'Near Defect Free GaN Substrates', Journal of Nitride Semiconductor, 1999, pp. 1-11.
Sarva et al., 'Dynamic Compressive Strength of Silicon Carbide Under Uniaxial Compression', Material Sciences and Engineering, vol. A317, 2001, pp. 140-144.
Sharma et al., 'Vertically oriented GaN-based air-gap distributed Bragg reflector structure fabricated using bad-gap-selective photoelectrochemical etching', Applied Physics Letters, vol. 87, 2005, pp. 051107.
Sumiya et al., 'High-pressure synthesis of high-purity diamond crystal', Diamond and Related Materials, 1996, vol. 5, pp. 1359-1365.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013.
Communication from the Chinese Patent Office re 200980134876.2 dated Jul. 3, 2013, 14 pages.
Communication from the Polish Patent Office re P394857 dated Aug. 14, 2013, 2 pages.

(56) References Cited

OTHER PUBLICATIONS

Wang et al., 'Ammonothermal Growth of GaN Crystals in Alkaline Solutions', Journal of Crystal Growth, vol. 287, 2006, pp. 376-380.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Office Action for U.S. Appl. No. 12/133,364 dated Nov. 26, 2010, 6 pages.
USPTO Office Action for U.S. Appl. No. 12/133,364 dated Jun. 1, 2011, 7 pages.
USPTO Notice of Allowance for U.S. Appl. No. 12/133,364 dated Oct. 11, 2011, 5 pages.
USPTO Office Action for U.S. Appl. No. 12/133,365 dated Jun. 9, 2011, 17 pages.
USPTO Office Action for U.S. Appl. No. 12/133,365 dated Oct. 18, 2011, 22 pages.
USPTO Office Action for U.S. Appl. No. 12/133,365 dated May 13, 2013, 23 pages.
USPTO Office Action for U.S. Appl. No. 12/133,365 dated Aug. 21, 2013, 29 pages.
USPTO Office Action for U.S. Appl. No. 12/334,418 dated Apr. 5, 2011, 20 pages.
USPTO Office Action for U.S. Appl. No. 12/334,418 dated Oct. 19, 2011, 24 pages.
USPTO Office Action for U.S. Appl. No. 12/334,418 dated Sep. 17, 2013, 27 pages.
USPTO Office Action for U.S. Appl. No. 12/478,736 dated Sep. 27, 2011, 11 pages.
USPTO Office Action for U.S. Appl. No. 12/478,736 dated Feb. 7, 2012, 6 pages.
USPTO Notice of Allowance for U.S. Appl. No. 12/478,736 dated Apr. 23, 2012, 8 pages.
USPTO Notice of Allowance for U.S. Appl. No. 12/478,736 dated Oct. 9, 2012, 4 pages.
USPTO Office Action for U.S. Appl. No. 12/484,095 dated Nov. 10, 2010, 9 pages.
USPTO Office Action for U.S. Appl. No. 12/484,095 dated Jul. 8, 2011, 12 pages.
USPTO Office Action for U.S. Appl. No. 12/497,969 dated Feb. 2, 2012, 20 pages.
USPTO Office Action for U.S. Appl. No. 12/497,969 dated Jul. 5, 2012, 18 pages.
USPTO Office Action for U.S. Appl. No. 12/497,969 dated May 16, 2013, 22 pages.
USPTO Office Action for U.S. Appl. No. 12/497,969 dated Sep. 6, 2013, 21 pages.
USPTO Office Action for U.S. Appl. No. 12/534,843 dated Sep. 10, 2012, 10 pages.
USPTO Notice of Allowance for U.S. Appl. No. 12/534,843 dated Jan. 24, 2013, 9 pages.
USPTO Office Action for U.S. Appl. No. 12/534,844 dated Sep. 16, 2010, 8 pages.
USPTO Office Action for U.S. Appl. No. 12/534,844 dated Feb. 4, 2011, 9 pages.
USPTO Notice of Allowance for U.S. Appl. No. 12/534,849 dated Jul. 31, 2012, 12 pages.
USPTO Office Action for U.S. Appl. No. 12/534,857 dated Sep. 1, 2010, 13 pages.
USPTO Notice of Allowance for U.S. Appl. No. 12/534,857 dated May 27, 2011, 5 pages.
USPTO Office Action for U.S. Appl. No. 12/546,458 dated Jul. 20, 2011, 5 pages.
USPTO Notice of Allowance for U.S. Appl. No. 12/546,458 dated Nov. 28, 2011, 5 pages.
USPTO Office Action for U.S. Appl. No. 12/556,558 dated Sep. 16, 2010, 8 pages.
USPTO Notice of Allowance for U.S. Appl. No. 12/556,558 dated Mar. 22, 2011, 5 pages.
USPTO Office Action for U.S. Appl. No. 12/556,562 dated Sep. 15, 2010, 7 pages.
USPTO Office Action for U.S. Appl. No. 12/556,562 dated Mar. 21, 2011, 5 pages.
USPTO Notice of Allowance for U.S. Appl. No. 12/556,562 dated Jul. 27, 2011, 5 pages.
USPTO Office Action for U.S. Appl. No. 12/569,337 dated May 9, 2012, 19 pages.
USPTO Notice of Allowance for U.S. Appl. No. 12/569,337 dated Nov. 15, 2012, 5 pages.
USPTO Office Action for U.S. Appl. No. 12/569,844 dated Oct. 12, 2012, 12 pages.
USPTO Office Action for U.S. Appl. No. 12/634,665 dated Apr. 25, 2012, 11 pages.
USPTO Office Action for U.S. Appl. No. 12/634,665 dated Oct. 1, 2012, 10 pages.
USPTO Notice of Allowance for U.S. Appl. No. 12/634,665 dated Feb. 15, 2013, 9 pages.
USPTO Office Action for U.S. Appl. No. 12/636,683 dated Jun. 12, 2013, 15 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 12/724,983 dated Mar. 5, 2012, 21 pages.
USPTO Office Action for U.S. Appl. No. 12/785,404 dated Mar. 6, 2012, 10 pages.
USPTO Notice of Allowance for U.S. Appl. No. 12/785,404 dated Jul. 16, 2012, 5 pages.
USPTO Office Action for U.S. Appl. No. 12/891,668 dated Sep. 25, 2012, 21 pages.
USPTO Office Action for U.S. Appl. No. 12/891,668 dated Jan. 10, 2013, 31 pages.
USPTO Notice of Allowance for U.S. Appl. No. 12/891,668 dated Mar. 20, 2013, 14 pages.
USPTO Office Action for U.S. Appl. No. 13/025,833 dated Jul. 12, 2012, 16 pages.
USPTO Office Action for U.S. Appl. No. 13/041,199 dated Nov. 30, 2012, 14 pages.
USPTO Office Action for U.S. Appl. No. 13/041,199 dated Mar. 12, 2013, 10 pages.
USPTO Office Action for U.S. Appl. No. 13/175,739 dated Dec. 7, 2012, 6 pages.
USPTO Notice of Allowance for U.S. Appl. No. 13/175,739 dated Mar. 21, 2013, 6 pages.
USPTO Office Action for U.S. Appl. No. 13/179,346 dated Dec. 13, 2012, 24 pages.
USPTO Office Action for U.S. Appl. No. 13/226,249 dated Oct. 10, 2012, 7 pages.
USPTO Notice of Allowance for U.S. Appl. No. 13/226,249 dated Feb. 21, 2013, 5 pages.
USPTO Office Action for U.S. Appl. No. 13/272,981 dated Mar. 20, 2013, 19 pages.
USPTO Office Action for U.S. Appl. No. 13/272,981 dated Aug. 15, 2013, 13 pages.
USPTO Office Action for U.S. Appl. No. 13/346,507 dated Dec. 21, 2012, 9 pages.
USPTO Notice of Allowance for U.S. Appl. No. 13/346,507 dated Apr. 22, 2013, 8 pages.
USPTO Notice of Allowance for U.S. Appl. No. 13/425,304 dated Aug. 22, 2012, 9 pages.
USPTO Notice of Allowance for U.S. Appl. No. 13/548,931 dated Jun. 3, 2013, 11 pages.
USPTO Office Action for U.S. Appl. No. 14/022,587 dated Jul. 30, 2014 (9 pages).
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.

(56) References Cited

OTHER PUBLICATIONS

USPTO Notice of Allowance for U.S. Appl. No. 13/272,981 dated Mar. 13, 2014, 10 pages.
Saito et al., 'Plane Dependent Growth of GaN in Supercritical Basic Ammonia', Applied Physics Express, vol. 1, No. 12, Dec. 2008, pp. 121103-1-121103-3.
Communication from the Japanese Patent Office re 2013-117510 dated Sep. 24, 2014 (8 pages).
Communication from the Japanese Patent Office re 2013-263760 dated Nov. 14, 2014 (11 pages).
Hayakawa et al., 'Analysis of trace Co in synthetic diamonds using synchroton radiation excited X-ray fluorescence analysis', Journal of Crystal Growth, vol. 210, Mar. 1, 2000, pp. 388-394.
Kumar et al., 'Guest Editorial Special Issue on Light-Emitting Diodes', IEEE Transactions on Electron Devices, vol. 57, No. 1, Jan. 2010, pp. 7-11.
Laufer et al., 'Determination of secondary ion mass spectrometry relative sensitivity factors for polar and non-polar ZnO', Journal of Applied Physics, vol. 110, 2011, pp. 094906-1-094906-5.
Sekiguchi et al., 'Hydrothermal growth of ZnO single crystals and their optical characterization', Journal of Crystal Growth, vol. 214-215, Jun. 2, 2000, pp. 72-76.
USPTO Office Action for U.S. Appl. No. 13/787,582 dated Jan. 22, 2015 (16 pages).

\* cited by examiner

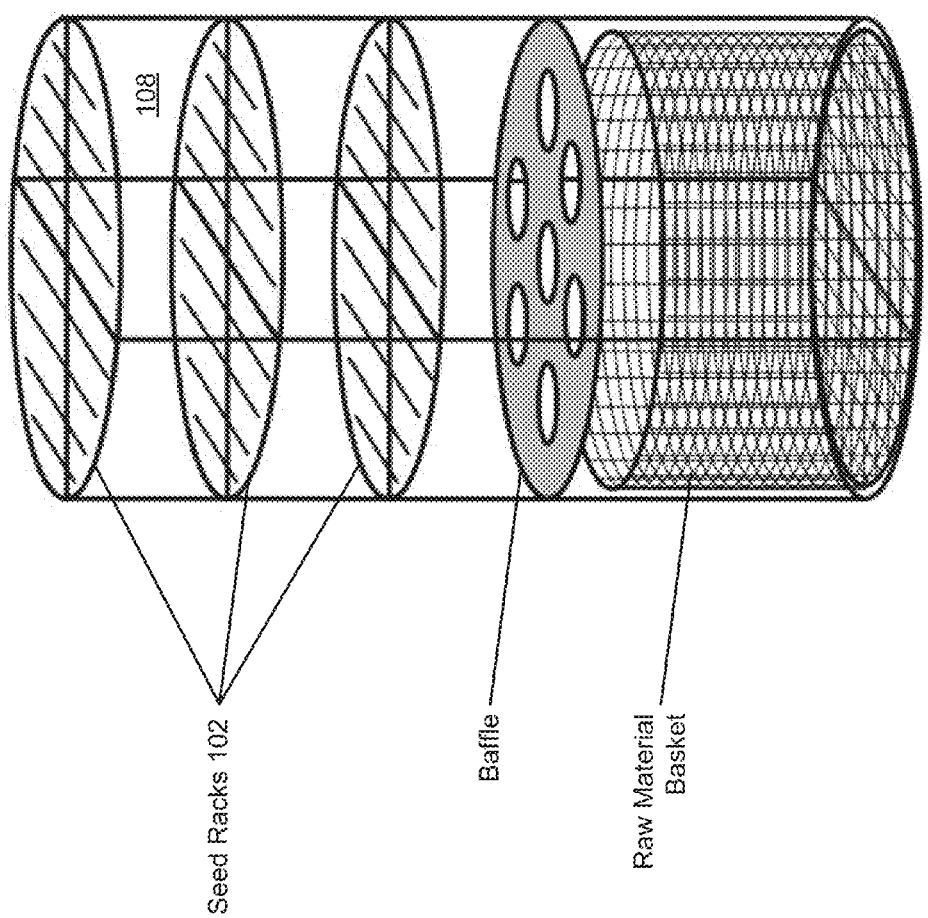

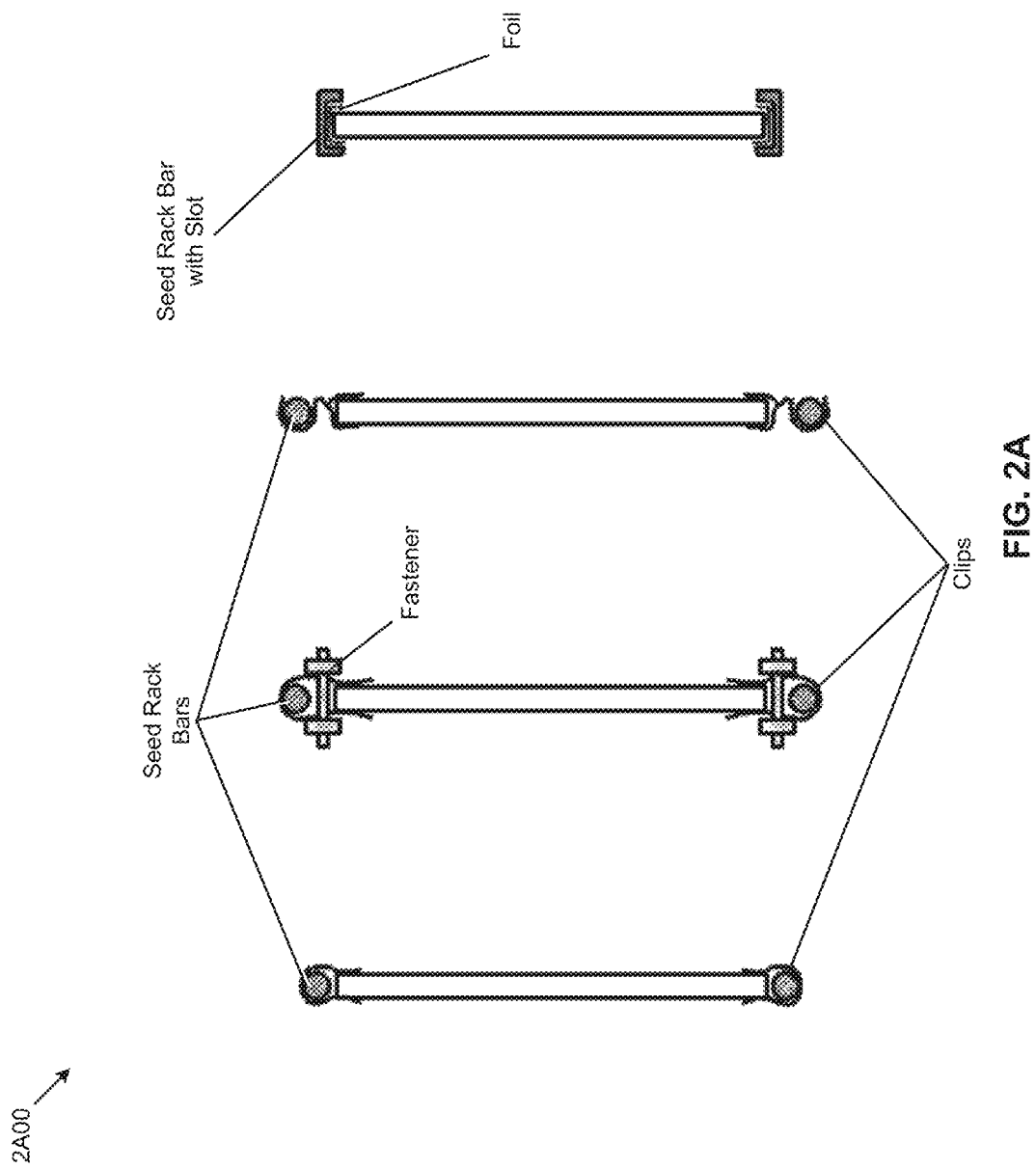

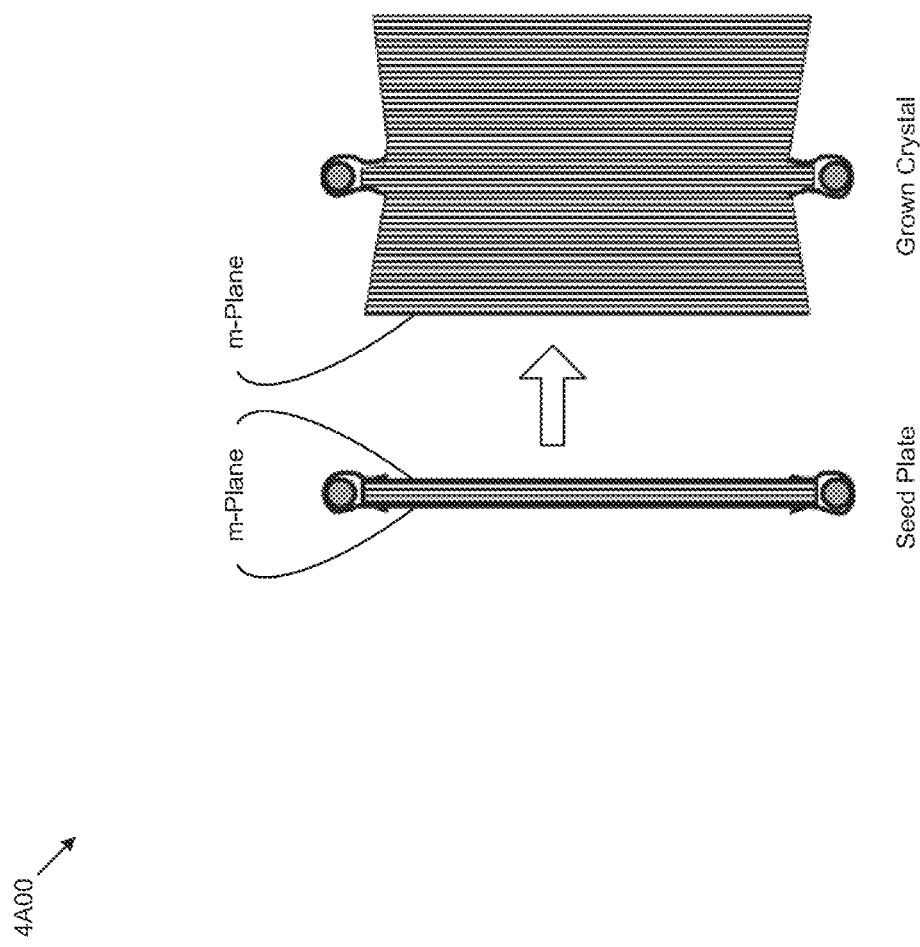

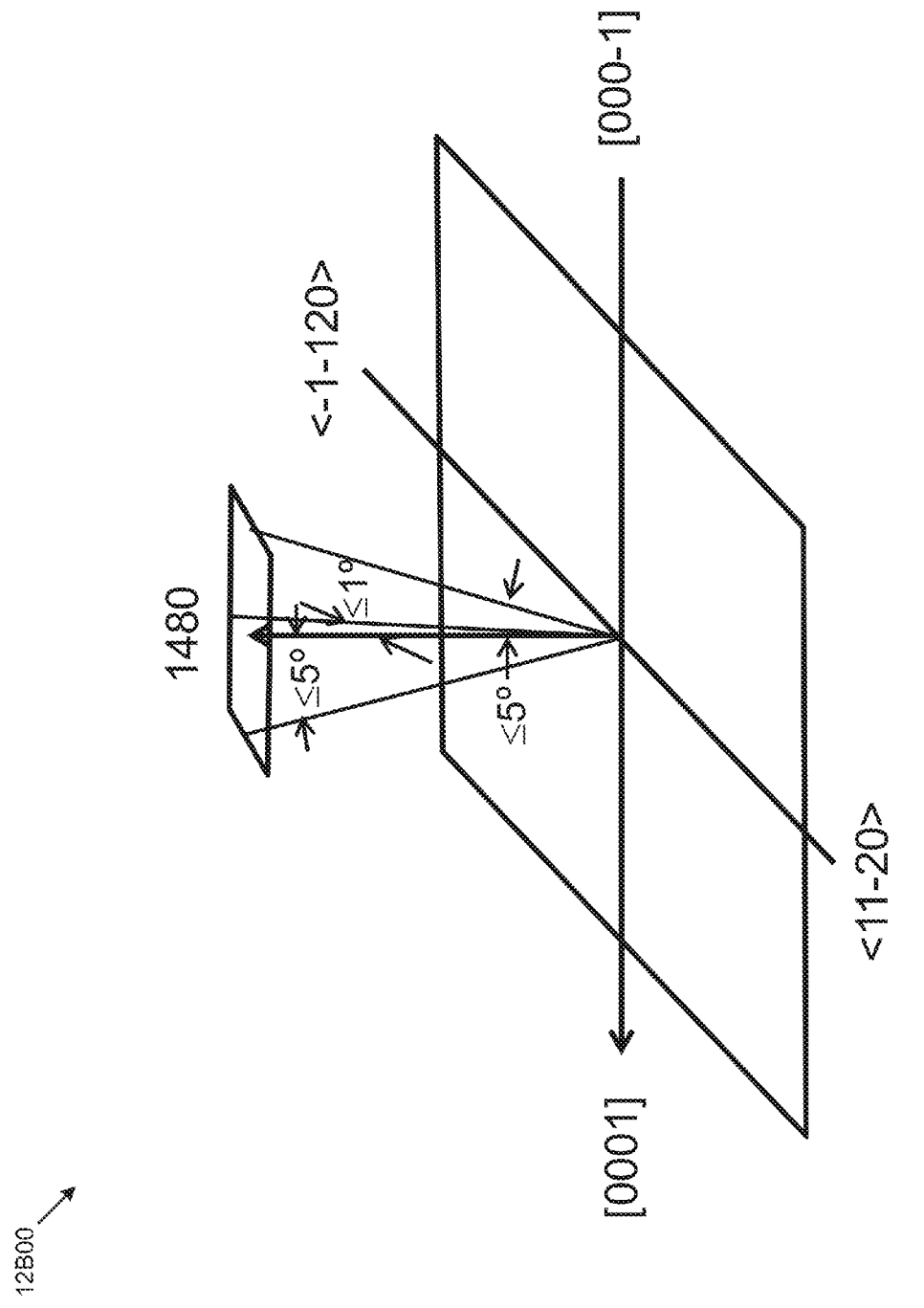

PROCESS FOR LARGE-SCALE AMMONOTHERMAL MANUFACTURING OF SEMIPOLAR GALLIUM NITRIDE BOULES

This application claims the benefit under 35 U.S.C. § 119(e) of U.S. Provisional Application No. 61/655,172, filed on Jun. 4, 2012, which is incorporated by reference in its entirety.

GOVERNMENT LICENSE RIGHTS

This invention was made with government support under Contract DE-SC0006168 awarded by the U.S. Department of Energy. The government has certain rights in the invention.

BACKGROUND

The present disclosure generally relates to processing of materials for growth of crystals. More particularly, the present disclosure provides methods for obtaining a gallium-containing nitride crystal by an ammonothermal technique, including ammonobasic or ammonoacidic techniques, but there can be others. In certain embodiments, the present disclosure provides an apparatus for large scale processing of nitride crystals, but it would be recognized that other crystals and materials may also be processed. Such crystals and materials include, for example, GaN, AlN, InN, InGaN, AlGaN, AlInN, and AlInGaN, and others for manufacture of bulk or patterned substrates. Such bulk or patterned substrates may be used for a variety of applications including optoelectronic devices, lasers, light emitting diodes, solar cells, photoelectrochemical water splitting and hydrogen generation devices, photodetectors, integrated circuits, power electronics, and transistors, among other devices.

Gallium nitride containing crystalline materials serve as a starting point for manufacture of conventional optoelectronic devices, such as blue light emitting diodes and lasers. Such optoelectronic devices have been commonly manufactured on sapphire or silicon carbide substrates that differ in composition from the deposited nitride layers. In conventional Metal-Organic Chemical Vapor Deposition (MOCVD) methods, deposition of GaN is performed from ammonia and organometallic compounds in the gas phase. Although successful, conventional growth rates make it difficult to provide a bulk layer of GaN material. Additionally, dislocation densities are also high and lead to poor optoelectronic device performance.

Other techniques have been proposed for obtaining bulk monocrystalline gallium nitride. Such techniques include epitaxial deposition employing halides and hydrides in a vapor phase, e.g., Hydride Vapor Phase Epitaxy (HVPE) (Motoku et al., "Growth and characterization of freestanding GaN substrates," Journal of Crystal Growth 237-239, 912 (2002)). Unfortunately, drawbacks exist with HVPE techniques. In some cases, the quality of the bulk monocrystalline gallium nitride is not generally sufficient for high quality laser diodes because of issues with dislocation density, stress, and the like. In addition, scale-up of HVPE is difficult and costs tend to be high, particularly for manufacturing of semipolar boules and wafers.

Techniques using supercritical ammonia have been proposed. Peters has described the ammonothermal synthesis of aluminum nitride (J. Cryst. Growth 104, 411-418 (1990)). Dwilinski et al. have shown that it is possible to obtain fine-crystalline gallium nitride by a synthesis from gallium and ammonia, provided that the latter contains alkali metal amides ($KNH_2$ or $LiNH_2$). These and other techniques have been described in "AMMONO method of BN, AlN, and GaN synthesis and crystal growth," Proc. EGW-3, Warsaw, Jun. 22-24, 1998, MRS Internet Journal of Nitride Semiconductor Research, "Crystal growth of gallium nitride in supercritical ammonia," Kolis et al., J. Cryst. Growth 222, 431-434 (2001), and Kolis et al., Mat. Res. Soc. Symp. Proc. Vol. 495, 367-372 (1998). However, using these supercritical ammonia processes, wide scale production of bulk monocrystalline was not achieved, particularly for semipolar boules and wafers.

Dwilinski, in U.S. Pat. Nos. 6,656,615 and 7,335,262, and D'Evelyn, in U.S. Pat. Nos. 7,078,731 and 7,101,433, disclose apparatus and methods for conventional ammonothermal crystal growth of GaN. These methods are useful for growth of relatively small GaN crystals. Unfortunately, such methods have limitations for large scale manufacturing. The conventional apparatus with an inner diameter of 40 mm is useful for growing smaller diameter GaN crystals but is not suitable for large scale growth of GaN boules. Additionally, conventional suspension of seed crystals using wires passing through single laser-drilled holes may be adequate for small crystals but is not amenable to large scale manufacturing. Other limitations may also exist.

From the above, it can be appreciated that improved techniques for large scale GaN crystal growth are desired, particularly for semipolar boules and wafers.

BRIEF SUMMARY

According to the present disclosure, techniques related to processing of materials for growth of gallium-containing nitride crystals are provided. More particularly, the present disclosure provides methods for obtaining a gallium-containing nitride crystal by an ammonothermal technique, including ammonobasic and ammonoacidic techniques, but there can be others. In certain embodiments, the present disclosure provides apparatus for large scale processing of gallium-containing nitride crystals; however, other crystals and materials can also be processed using the methods disclosed herein. Such crystals and materials include, for example, GaN, AlN, InN, InGaN, AlGaN, AlInN, and AlInGaN, BN and alloys thereof, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, power electronics, transistors, and other devices.

In a first aspect, gallium-containing nitride crystals or wafers are provided, comprising: a crystalline substrate member having a length greater than about 5 millimeters; large-area surfaces having a semipolar orientation, wherein the semipolar orientation is miscut from each of the m-plane and c-plane orientations by at least about 5 degrees; and an impurity concentration greater than about $10^{16}$ $cm^{-3}$ of at least one impurity selected from O, H, Li, Na, K, F, Cl, Br, I, Cu, Mn, and Fe, wherein the at least one impurity has a distribution along a direction parallel at least one large-area surface of the crystal or wafer comprising at least 4 bands of alternating higher and lower impurity concentrations of the at least one impurity, wherein the higher impurity concentration is higher is between about 1.05 times and about 40 times the lower impurity concentration.

In a second aspect, methods for fabricating a gallium-containing nitride semipolar wafer are provided, the methods comprising: providing a gallium-containing source material; providing a mineralizer; providing a plurality of gallium-containing nitride seed plates, wherein each of the plurality of seed plates comprises a first large-area surface with a first crystallographic orientation within about 5 degrees of a growth orientation selected from m-plane, c-plane, and {1 0 −1 ±1}; and wherein the growth orientation of each of the plurality of seed plates is equivalent to within about 5 degrees, and the first crystallographic orientation of at least two of the plurality of seed plates differs by at least about 0.05 degrees; supporting the plurality of seed plates in a seed rack, wherein the seed rack is substantially rigid under processing conditions; placing the source material, the mineralizer, and the seed rack supporting the plurality of seed plates in a sealable container; introducing a nitrogen-containing solvent into the sealable container; processing the source material, the mineralizer, and the plurality of seed plates contained in the sealable container in a supercritical fluid at a temperature higher than about 400 degrees Celsius and a pressure higher than about 1 kbar; growing each of the plurality of seed plates into boules having a thickness of at least D sin ζ, wherein D is the minimum diameter of the semipolar wafer and ζ is the angle, greater than or equal to about 5 degrees, between a growth orientation and the first semipolar crystallographic orientation; removing the plurality of boules from the sealable container; and slicing at least one of the plurality of boules into at least one semipolar wafer having a diameter at least equal to D.

In a third aspect, methods for fabricating a gallium-containing nitride semipolar wafer are provided, the methods comprising: providing a gallium-containing source material; providing a mineralizer; providing a plurality of gallium-containing nitride seed plates, wherein each of the plurality of seed plates comprises large-area surfaces, wherein each of the large-area surfaces has a semipolar crystallographic orientation intermediate between m-plane and {1 0 −1 ±1}, with a miscut between about 5 and about −5 degrees in the [0001] c-direction and a miscut less than or equal to 1 degree in the <11-20> a-direction; and supporting the plurality of seed plates in a seed rack; placing the source material, the mineralizer, and the seed rack supporting the plurality of seed plates in a sealable container; introducing a nitrogen-containing solvent into the sealable container; processing the source material, the mineralizer, and the plurality of seed plates contained in the sealable container in a supercritical fluid at a temperature higher than about 400 degrees Celsius and a pressure higher than about 1 kbar; growing each of the plurality of seed plates into boules at least 0.5 millimeter thick under conditions wherein at least one growth surface comprises at least two facets, a growth orientation of the facets differing by an angle θ between about 20 degrees and about 75 degrees, wherein each of the plurality of boules have a thickness of at least D sin ζ, wherein D is the minimum diameter of the semipolar wafers and ζ is the angle, greater than or equal to about 5 degrees, between the growth orientation and the semipolar crystallographic orientation; removing the plurality of boules from the sealable container; and slicing or sectioning at least one of the plurality of boules into at least one semipolar wafer having a diameter at least equal to 25 millimeters.

The present disclosure achieves these benefits and others in the context of known process technology. However, a further understanding of the nature and advantages of the present disclosure may be realized by reference to the specification and attached drawings.

BRIEF DESCRIPTION OF THE DRAWINGS

FIG. 1A and FIG. 1B show crystal growth frame structures according to embodiments of the present disclosure.

FIG. 2A, FIG. 2B, and FIG. 2C show crystal growth seed rack structures according to embodiments of the present disclosure.

FIG. 4A and FIG. 4B are simplified diagrams illustrating crystal growth processes according to embodiments of the present disclosure.

FIG. 12A, FIG. 12B, and FIG. 12C are simplified diagrams showing a range of crystallographic orientations suitable for seed crystals for semipolar crystal growth as used in certain embodiments of the present disclosure.

DETAILED DESCRIPTION

According to the present disclosure, techniques related to processing of materials for growth of crystals including wafers are provided. More particularly, the present disclosure provides methods for obtaining a gallium-containing nitride crystal by an ammonobasic or ammonoacidic technique, but there can be others. In certain embodiments, the present disclosure provides an apparatus for large scale processing of nitride crystals, but other crystals and materials can also be processed. Such crystals and materials include, for example, GaN, AlN, InN, InGaN, AlGaN, AlInGaN, BN and its alloys, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, power electronics, integrated circuits, and transistors, and other devices. An example of a suitable apparatus for ammonothermal crystal growth of gallium-containing nitride crystals, including ammonoacidic and ammonobasic variations, is shown in FIG. 12.

Figure 5:
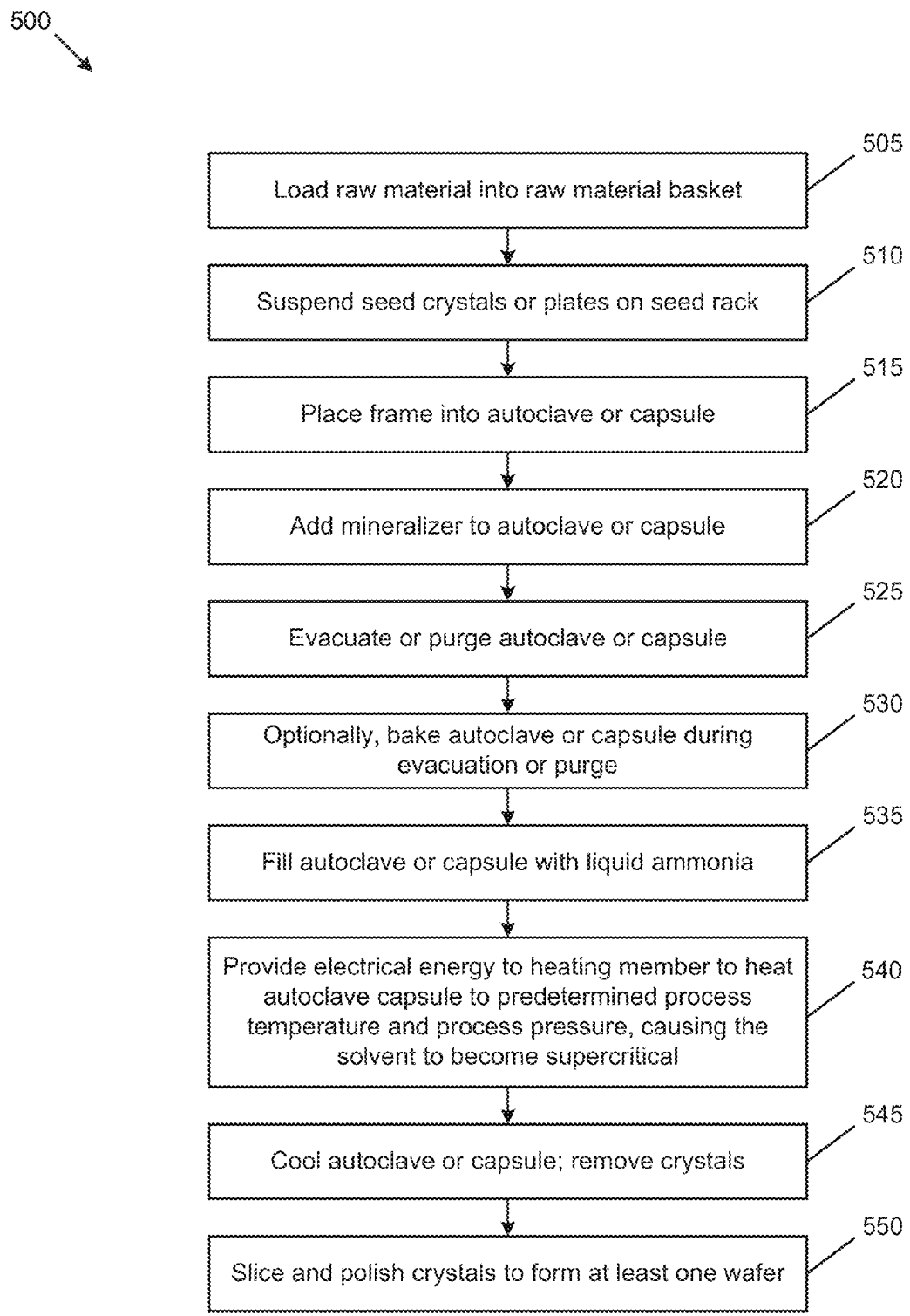
FIG. 5 is a simplified diagram of flow chart illustrating a crystal growth process according to an embodiment of the present disclosure.

In the discussion that follows, the present apparatus is described as being vertically oriented. In certain embodiments, the apparatus is instead horizontally oriented or oriented at an oblique angle intermediate between vertical and horizontal, and may be rocked so as to facilitate convection of a supercritical fluid within the high pressure apparatus. The present methods may be used in conjunction with a sealable container and high pressure apparatus. Examples of suitable apparatus are described, for example, in U.S. Pat. Nos. 7,101,433; 7,125,453; 7,160,388; 7,942, 970; and 8,097,081, and in U.S. Publication Nos. 2009/ 030101388A1 and 2010/0320744A1. Reference is also made to FIG. 5, which lists the general steps for carrying out a process of crystal growth according to embodiments of the present disclosure. As shown, FIG. 5 is merely an illustration and is not intended to limit the scope of the claims herein. The general steps described in FIG. 5 may be performed in a different order or one or may steps may be removed or added. One of ordinary skill in the art will recognize that there are other variations, modifications, and alternatives.

Figure 1B:
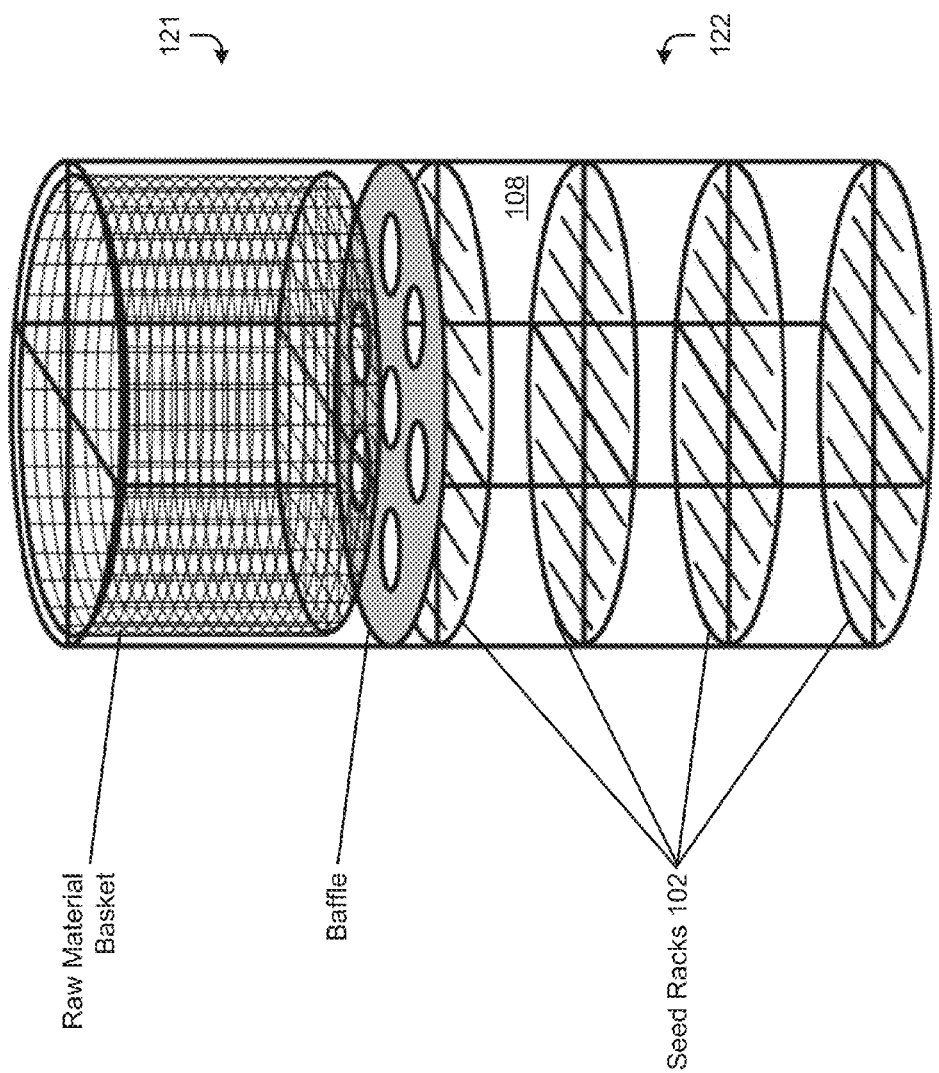

Schematics of a frame 100 for seed crystals and raw material is shown in FIG. 1A and FIG. 1B. The frame 100 enables seed crystals and raw material to be loaded into a suitable configuration for crystal growth prior to placement inside a sealable container (e.g., a high pressure apparatus, such as an autoclave or a capsule for placing into an autoclave or into an internally-heated high pressure apparatus) and in a form that is convenient for subsequent handling. The frame retains good rigidity under crystal growth conditions and is substantially chemically inert to the crystal growth environment, neither contributing significantly to contamination of the growing crystals nor undergoing significant corrosion. The materials of construction of the frame and the components thereof may include, for example, one or more of copper, copper-based alloy, gold, gold-based alloy, silver, silver-based alloy, palladium, platinum, iridium, ruthenium, rhodium, osmium, titanium, vanadium, chromium, chromium-based alloy, iron, iron-based alloy, nickel, nickel-based alloy, zirconium, niobium, molybdenum, tantalum, tungsten, rhenium, silica, alumina, zirconia, hafnia, combinations of any of the foregoing, and the like. Iron-based alloys that may be used to form the frame include, but are not limited to, stainless steels. Nickel-base alloys that may be used to form the frame include, but are not limited to, Inconel®, Hastelloy®, and the like. Again, there can be other variations, modifications, and alternatives. In certain embodiments, the components of the frame are fabricated from an alloy comprising at least two elements, for increased hardness and creep resistance. The frame and its components may comprise wire, wire cloth or mesh, foil, plate, sheet, square bar, round bar, rectangular bar, hexagonal bar, tubing, threaded rod, nuts, springs, and fasteners. The frame and its components may be attached by means of welding, arc welding, resistance welding, ultrasonic welding, brazing, clamping, attachment by means of fasteners such as at least one of screws, bolts, springs, threaded rod, nuts, and the like.

The frame may include, as components, a baffle, a raw material basket, and seed racks 102 for suspending seed crystal plates, plus a means for attaching at least two of the aforementioned components. In certain embodiments, as illustrated in FIG. 1A, appropriate for situations where the crystal to be grown has a solubility that increases with increasing temperature, the raw material basket is positioned below the baffle and the seed rack is positioned above the baffle. In certain embodiments, as illustrated in FIG. 1B, appropriate for the case where the crystal to be grown has a solubility that decreases with increasing temperature, i.e., retrograde solubility, the raw material basket is positioned above the baffle and the seed rack is positioned below the baffle. A larger volume may be provided for the crystal growing region 122, that is, the region containing the seed rack, than for the nutrient region 121, that is, the region containing the raw material basket. In certain embodiments, the ratio of the volumes of the crystal growing region and the nutrient region is between about 1 and about 5. In certain embodiments, this ratio is between about 1.25 and about 3, or between about 1.5 and about 2.5. The overall diameter and height of the frame may be chosen for a close fit within the high pressure apparatus, so as to maximize the utilization of the available volume and optimize the fluid dynamics. The diameter of the frame may be between about 0.5 inch and 1 inch, between about 1 inch and about 2 inches, between about 2 inches and about 3 inches, between about 3 inches and about 4 inches, between about 4 inches and about 6 inches, between about 6 inches and about 8 inches, between about 8 inches and about 10 inches, between about 10 inches and about 12 inches, between about 12 inches and about 16 inches, between about 16 inches and about 24 inches, or greater than about 24 inches. The ratio of the overall height of the frame to its diameter may be between about 1 and about 2, between about 2 and about 4, between about 4 and about 6, between about 6 and about 8, between about 8 and about 10, between about 10 and about 12, between about 12 and about 15, between about 15 and about 20, or greater than about 20.

The baffle provides a means for dividing the sealable container into two separate regions (e.g., nutrient region 121, and a crystal growing region 122). The frame to be inserted into the sealable container comprises one or more disks. The two regions are in fluid communication with each other, that is, convection between the two regions is possible, as the baffle has a plurality of through-holes, openings, and/or an annular gap with respect to the inner diameter of the sealable container. Thus, a fraction of the cross-sectional area of the baffle is open. In a specific embodiment, the baffle has a fractional open area of between about 0.5% and about 30%, but can also have other percentages. In certain embodiments, the baffle has a fractional open area between about 2% and about 20%, or between about 5% and about 15%. The baffle serves the purpose of confining the at least one (or more) volumes of source material to a specific region or end of chamber 108, for example, within the raw material basket, while permitting solvent and, under high pressure high temperature (HPHT) conditions, supercritical fluid, to migrate throughout the sealable container by passing freely through through-holes in baffle. In certain embodiments, this feature is particularly useful in applications such as crystal growth, in which the supercritical fluid transports one material (e.g., a nutrient material), from one region of the chamber, defined by placement of baffle, to another region where crystal growth on seed crystals takes place. In certain embodiments, the diameter of the baffle is equal to the maximum diameter of the overall frame. In certain embodiments, the diameter of the baffle is slightly less than the maximum diameter of the overall frame, providing an annular space through which fluid can flow under crystal growth conditions. The diameter of the baffle may be less than the maximum diameter of the overall frame by about 0.5 inch or less. In certain embodiments, the diameter of the baffle is larger than the diameter of the overall frame. The diameter of the baffle may be larger than the maximum diameter of the overall frame by about 0.1 inch or more. The openings in the baffle should be large enough so as not to readily clog. In embodiments, the diameters of the openings in the baffle are between about 0.020 inch and about 0.5 inch. In certain embodiments, the diameters of the openings in the baffle are between about 0.050 inch and about 0.25 inch. In one specific embodiment, the baffle comprises a single disk with a thickness between about 0.020 inch and about 0.5 inch. In certain embodiments, the baffle comprises a single disk with a thickness between about 0.020 inch and about 0.25 inch. In certain embodiments, the baffle comprises two disks, three disks, or more. In some multi-disk embodiments one or more of the openings in the disks lie above one another. In certain multi-disk embodiments, one or more of the openings in the disks do not lie above one another. The effective fractional open area in multi-disk baffle embodiments may therefore lie between the fractional open area of each disk, as an upper bound, and the product of the fractional open areas of each disk.

The raw material basket provides a convenient means for transferring the raw material, including source material and mineralizer, into the sealable container, for permitting facile fluid convection from the region between source material particles within the raw material basket and the crystal growth region, and for removing un-consumed source material from the reactor at the conclusion of a growth run. In certain embodiments, the raw material basket comprises wire mesh or wire cloth, as indicated schematically in the figures. The diameter of the wire in the mesh or cloth may be between about 0.001 inch and about 0.25 inch, between about 0.005 inch and about 0.125 inch, or between about 0.010 inch and about 0.080 inch. The mesh or cloth may be defined by a percentage of open area which comprises the ratio of open space between the wires to the total area of the piece of mesh or cloth. The percent open area may be between about 1% and about 99%, between about 2% and about 50%, or between about 5% and about 30%. The wire mesh or wire cloth may be contained within, around and/or, optionally, attached to a frame comprising larger-diameter wire or rod so as to provide improved mechanical support. In certain embodiments, the raw material basket comprises foil or plate with a plurality of through-holes, slots, slits, or openings. The size of the openings in the wire mesh, wire cloth, or foil or plate should be small enough so that raw material particles do not pass through them during crystal growth, even after a significant portion of the raw material has been etched and/or consumed by the crystal growth operation. In one specific embodiment, the openings in the wire mesh, wire cloth, or foil or plate have a diameter between about 0.005 inch and about 0.5 inch. In certain embodiments, the openings have a diameter between about 0.010 inch and about 0.125 inch, or between about 0.025 inch and about 0.080 inch. In certain embodiments, hollow pipes, with openings that may be covered by wire mesh, are placed within the raw material basket prior to loading of the raw material so as to improve fluid communication between the region between raw material particles within the raw material basket and the crystal growth region. Suitable configurations for such hollow pipes are disclosed, for example, in U.S. Pat. No. 3,245,760.

In certain embodiments, the source material is placed in the raw material basket prior to placement of seed crystals on the seed rack, so as to minimize the likelihood of breakage of the seed crystals. The source material may be supplied in various forms. In certain embodiments, the source material comprises single crystals or chunks or grit of polycrystalline material. In certain embodiments, the source material comprises chunks of sintered polycrystalline material. In the case of gallium nitride, the source material may be derived from by-product single- or poly-crystalline GaN deposited on the wall or miscellaneous surfaces with a hydride vapor phase epitaxy (HVPE) reactor. In certain embodiments, the source material comprises plates of single- or poly-crystalline GaN grown on a substrate by HVPE. In certain embodiments, the source material is derived from sintered GaN powder, as disclosed, for example, in U.S. Pat. No. 6,861,130. In certain embodiments, the source material is derived from polycrystalline GaN plates comprising a columnar microstructure, as disclosed, for example, in U.S. Publication No. 2010/0151194A1. In certain embodiments, the source material may comprise GaN grown by an ammonothermal method, including by-product material. The source material may contain oxygen provided as a Group III metal oxide or as a substitutional or interstitial impurity within a Group III metal nitride at a concentration below about $10^{19}$ cm$^{-3}$, below about $10^{18}$ cm$^{-3}$, or below about $10^{17}$ cm$^{-3}$. The source material may contain an n-type dopant, such as Si or O, a p-type dopant, such as Mg or Zn, a compensatory dopant, such as Fe or Co, or a magnetic dopant, such as Fe, Ni, Co, or Mn, at concentrations between about $10^{16}$ cm$^{-3}$ and about $10^{21}$ cm$^{-3}$. The source material may further comprise a getter, at a level greater than about 200 parts per million. In certain embodiments, the particle size distribution of the source material lies between about 0.020 inch and about 5 inches. In certain embodiments, the particle size distribution of the source material lies between about 0.050 inch and about 0.5 inch. In certain embodiments, the total surface area of the source material is greater, by at least a factor of three, than the total surface area of all the seed crystal plates that are placed in the seed rack. As used herein, the term plate encompasses seed crystals.

In certain embodiments, the source material comprises a metal that will become molten at elevated temperatures, for example, gallium or indium. In certain embodiments, the mineralizer comprises a metal that will become molten at elevated temperatures, for example, sodium, potassium, or lithium. If placed in direct contact with the inner surface of an autoclave or a capsule, the metal may form an alloy, compromising the integrity of the autoclave or capsule. In certain embodiments, therefore, at least one crucible is placed within or proximate to the raw material basket and contains at least one metal. The crucible should be substantially chemically inert with respect to the supercritical fluid crystal growth environment and should not react or alloy with the at least one metal. In certain embodiments, the crucible comprises molybdenum, tantalum, niobium, iridium, platinum, palladium, gold, silver, nickel, chromium, ruthenium, rhodium, tungsten, or a combination of any of the foregoing. In certain embodiments, the crucible comprises alumina, magnesia, calcia, zirconia, hafnia, yttria, aluminum nitride, boron nitride, gallium nitride, or a combination of any of the foregoing. The crucible may comprise a sintered or other polycrystalline material.

The seed rack provides a convenient means for transferring seed crystals or plates into the sealable container, for permitting facile fluid convection between the seed crystals or plates and the nutrient region on the other side of the baffle, and for removing the grown crystals from the reactor at the conclusion of a growth run. The seed rack should be easy to load and unload, enable efficient usage of the available crystal growth volume, and minimize breakage and other yield losses of the crystals.

In certain embodiments, the seed crystals or plates comprise gallium nitride. In certain embodiments, the seed crystals or plates may comprise aluminum nitride, indium nitride, indium gallium nitride, sapphire, silicon carbide, $MgAl_2O_4$ spinel, zinc oxide, boron nitride, or the like. The seed plates have a minimum lateral dimension of at least about one centimeter. In certain embodiments, the seed plates have a maximum lateral dimension of at least about two centimeters and a minimum lateral dimension of at least one centimeter. In certain embodiments, the seed plates have a minimum lateral dimension of at least about three centimeters, at least about four centimeters, at least about five centimeters, at least about six centimeters, at least about eight centimeters, or at least about ten centimeters. In certain embodiments, the seed plates are bulk single crystals of gallium nitride. In certain embodiments, the seed plates are prepared from crystals that are grown by hydride vapor phase epitaxy. In certain embodiments, the seed plates are prepared from crystals that are grown ammonothermally. In certain embodiments, the seed plates are prepared from crystals that are grown from solution. In certain embodiments, the seed plates are prepared by the method disclosed in U.S. Patent Application No. 61/078,704, which is incorporated by reference in its entirety. In certain embodiments, the dislocation density at the large-area surfaces of a seed plate is less than about $10^6$ cm$^{-2}$. In certain embodiments, the dislocation density at the large-area surfaces of a seed plates is less than about $10^5$ cm$^{-2}$, less than about $10^4$ cm$^{-2}$, less than about $10^3$ cm$^{-2}$, and in certain embodiments, less than about $10^2$ cm$^{-2}$. In certain embodiments, the full width at half maximum of the x-ray diffraction peak corresponding to the crystallographic orientation of a large-area surface is less than about 300 arc seconds, less than about 150 arc seconds, less than about 100 arc seconds, or less than about 50 arc seconds.

The hexagonal phase of gallium nitride is a wurtzite-structure crystal (space group $P6_3mc$; point group 6 mm) with distinct growth sectors. Under a given set of growth conditions, growth occurs at different rates in the +c direction, the −c direction, the m directions, the a directions, and in other crystallographic directions. In general, fast-growing directions tend to grow themselves out of existence, so that the resulting crystals are terminated mainly by facets associated with the slower-growing directions. The most commonly occurring facets under ammonothermal growth conditions are c-plane (0 0 0 1) and (0 0 0 −1), and m-plane {1 −1 0 0}. Other planes, for example, a-plane {1 1 −2 0} and semipolar {1 0 −1 1} and/or {1 0 −1 −1} occur less frequently or with smaller areas. Manufacturing efficiency is enhanced by using seed crystals or plates that are already large in a relatively slow-growing dimension, and performing the predominant crystal growth in a relatively faster growing direction. In certain embodiments, the large area faces of the seed plates are stable under the pre-selected growth conditions, i.e., do not facet, which is facilitated by selecting seed plates with (0 0 0 1), (0 0 0 −1), {1 0 −1 0}, {1 1 −2 0}, {1 0 −1 1}, or {1 0 −1 −1} orientations. The terms large-area face and large-area surface are used interchangeably herein.

In addition, the tendency for impurity uptake differs from one growth sector to another. For example, as shown by Frayssinet et al. (Journal of Crystal Growth, volume 230, pages 442-447 (2001)), the concentration of free carriers caused by point defects is markedly different in the +c and −c growth sectors of unintentionally-doped bulk GaN crystals grown by a particular technique. Similar results have been reported by other authors, with the general tendency that the (0 0 0 −1), or −c, growth sector incorporates a higher impurity concentration than does the (0 0 0 1), or +c, growth sector. Differential impurity uptake is undesirable for at least two reasons. First, the presence of concentration gradients within crystals makes it more difficult for the crystal manufacturer to maintain consistent product specifications. Second, the presence of concentration gradients within the crystal generates strain (typically, impurities in GaN cause a slight increase in the lattice constants), which can lead to bow, cracking, dislocation generation, and other detrimental effects. Manufacturing efficiency, including yield, product quality, and product consistency, is enhanced by restricting the predominant crystal growth to occur in only one growth sector.

In certain embodiments, manufacturing growth is desired to occur predominantly on m planes, as shown in diagram 4A00 of FIG. 4A. For example, under a predetermined set of growth conditions crystal growth may occur more rapidly in the a directions than in the m directions, and more rapidly in the m direction than in the +c or −c directions. Under such a predetermined set of growth conditions, spontaneously nucleated and grown crystals will take the shape of hexagonal platelets, with large c facets and long m-plane-terminated side edges and a thickness that is less than the diameter. Growth in the m direction may also be desired by virtue of improved crystallographic quality, reduced impurity incorporation, or, conversely, by increased capability for incorporation of dopants or band-gap modifiers such as Al or In. Growth in the m direction may provide a useful means for preparing semipolar substrate orientations. Opposite faces on an m-plane oriented seed crystal or plate will both constitute m planes, so use of such a seed crystal produces growth in a single crystallographic growth sector.

Figure 2B:
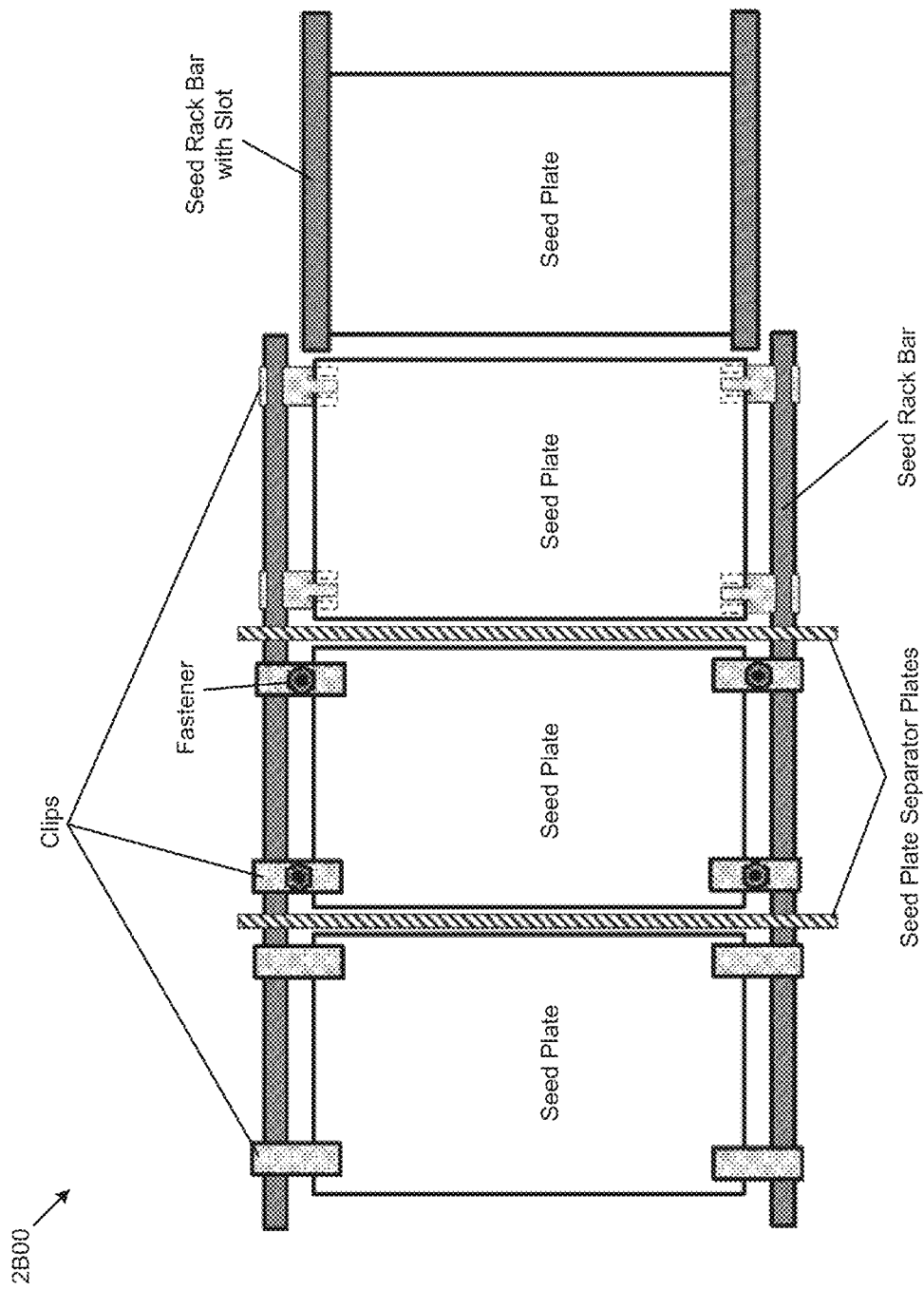
Figure 2C:
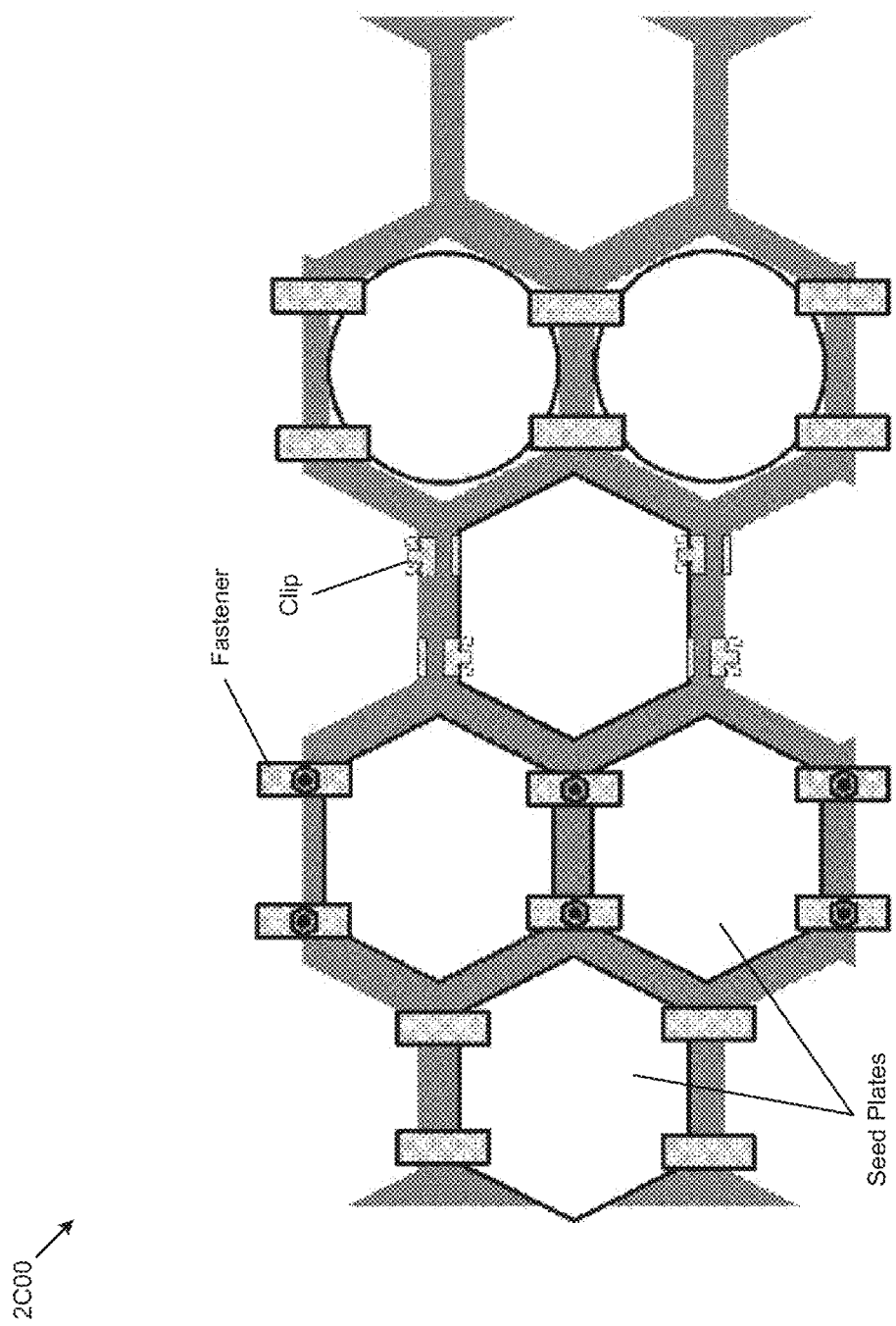

In certain embodiments, seed crystals are attached to a seed rack as shown in FIG. 2A, in FIG. 2B, and in FIG. 2C, diagrams 2A00, 2B00, and 2C00, respectively. Individual seed crystals or plates may be selected or cut to have approximately the same height and/or width, so that multiple seed crystals or plates may be placed adjacent to one another in a tier of the seed rack. The seed crystals may have rectangular large-area faces or surfaces. The seed crystals may be placed between upper and lower seed rack bars and held in place by means of clips. The clips may clamp the seed crystals by spring force, by virtue of the seed crystal being thicker than the separation between opposite sides of the clip when the latter is free standing and relaxed. In an alternative set of embodiments, the seed crystal is affixed to the clip by virtue of a fastener positioned proximate to the clip, seed crystal, and seed rack, such as a length of threaded rod with nuts on opposite ends. In certain embodiments, the clips are attached to the seed crystals first and then attached to the seed rack. In certain embodiments, the clips have at least one opening through which the crystal can grow, so as to minimize strain and defect generation. In certain embodiments, the seed rack comprises recesses, slots, hollows, or the like, into which opposite ends of the seed crystals are slid. Pieces of foil may be placed between the seed crystals and the recesses in the seed rack so as to facilitate removal after crystal growth. In certain embodiments, each seed crystal is attached to the seed rack in at least two positions, so as to minimize the likelihood of seed or crystal breakage before, during, or after crystal growth, and to hold the seed crystals accurately in the desired positions in the reactor. Adjacent seed crystals or plates may be separated by a crystal separator plate. The crystal separator plates may have holes that slide over the seed rack bar(s), may have slots that are open on one side so as to slide over the seed rack bar, or the like.

In certain embodiments, holes or slots are provided in the seed crystals or plates, and the seed crystals or plates are suspended from the seed rack by at least one wire or foil strip. In certain embodiments, the seed crystals are suspended by at least two, at least three, or at least four wires or foil strips. The holes or slots in the seed crystals or plates may be formed by laser drilling or cutting, by ultrasonic drilling, by mechanical drilling or milling, by grinding, by sanding, by electric discharge machining, by water jet cutting, water-jet-guided laser drilling or cutting, or the like.

Figure 4B:
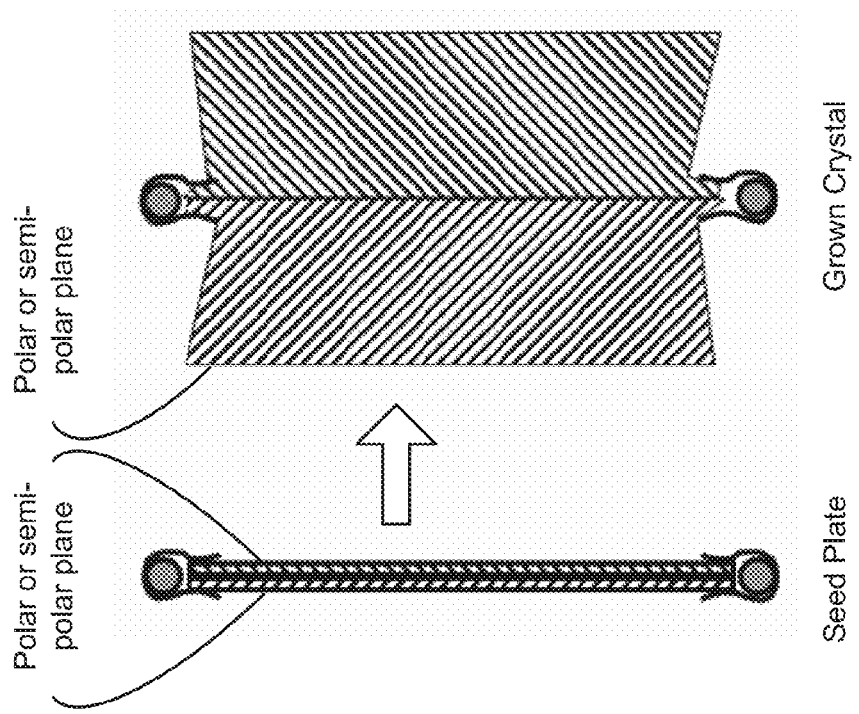

In certain embodiments, manufacturing growth is desired to occur predominantly on c-planes, that is, polar planes, either in the +c direction (the [0 0 0 1] Ga-polar direction) or −c direction (the [0 0 0 −1] N-polar direction), as shown in FIG. 4B. For example, under a predetermined set of growth conditions crystal growth may occur more rapidly in the +c or −c direction than in the m direction. Under such a predetermined set of growth conditions, spontaneously nucleated and grown crystals will take the shape of hexagonal pillars, prisms, or needles, with small c facets and long m-plane-terminated side edges and a length that is less than the diameter. Growth in the +c or −c direction may also be desired by virtue of improved crystallographic quality, reduced impurity incorporation, or, conversely, by increased capability for incorporation of dopants or band-gap modifiers such as Al or In. Opposite faces on a c-plane oriented seed crystal or plate constitute different planes, so use of such a seed crystal alone would produce growth in two distinct crystallographic growth sectors. Growth in a single crystallographic growth sector may be achieved by stacking pairs of c-plane-oriented seed crystals or plates back to back, with like faces facing one another. For example, the −c face of two c-plane-oriented seed crystals or plates may be faced proximate to one another, so that the +c faces of the two c-plane-oriented seed crystals or plates face outward and thereby yield growth in a single crystallographic orientation. Conversely, the +c face of two c-plane-oriented seed crystals or plates may be faced proximate to one another, so that the −c faces of the two c-plane-oriented seed crystals or plates face outward and thereby yield growth in a single crystallographic orientation. Pairs of seed crystals may be placed in direct contact with one another or may be separated by a crystal separator plate. Pairs of seed crystals placed back to back may be separated by a predetermined gap. The predetermined gap may be less than about 5 millimeters, less than about 2 millimeters, less than about 1 millimeter, less than about 0.3 millimeter, less than about 0.1 millimeter, less than about 0.03 millimeter, or less than about 0.01 millimeter. The predetermined gap may be essentially zero, that is, with the seed crystals in direct contact. If the pairs of seed crystals or plates grow together during a growth run they may be separated after the run, if desired, or may be left together for use as a seed (bi-) crystal in a subsequent run. A c-plane-oriented bi-crystal, on which both large-area faces constitute +c or −c surfaces, that is, polar surfaces, is suitable for use as a seed, as growth on the large area faces will occur in only a single crystallographic direction. At least one contact twin or stacking fault, oriented substantially parallel, for example within about 0.5 degrees, within about 0.1 degrees, within about 0.05 degrees, or within about 0.01 degrees, to the large-area surfaces, may be present in the bi-crystal. Schematic illustrations of a bi-crystal are shown in FIG. 4B, where the alternative shadings indicate grains that are separated by a twin, grain boundary, or other boundary. In certain embodiments, the back sides of the pairs of seed crystals may be wafer-bonded together, for example, using techniques described in U.S. Publication No. 2012/0000415, which is incorporated by reference in its entirety.

In certain embodiments, manufacturing growth is desired to occur predominantly on the semipolar $\{1\ 0\ -1\ \pm1\}$ family of planes, that is, one of the (1 −1 0 1), (−1 1 0 1), (1 0 −1 1), (−1 0 1 1), (0 1 −1 1), (0 −1 1 1), (1 −1 0 −1), (−1 1 0 −1), (1 0 −1 −1), (−1 0 1 −1), (0 1 −1 −1), or (0 −1 1 −1), planes. For brevity, the {h k i l} family of planes is referred to herein as the {h k i l} planes, the {h k i l} plane, or the (h k i l) plane. Similarly, for brevity the <h k i l> family of directions is referred to herein as the <h k i l> directions, the <h k i l> direction, or the [h k i l] direction. Growth in semipolar directions may be desired for improved crystallographic quality, reduced impurity incorporation, or, conversely, by increased capability for incorporation of dopants or band-gap modifiers such as Al or In. Growth perpendicular to the $\{1\ 0\ -1\ -1\}$ plane may also be suitable for producing $\{1\ 0\ -1\ -1\}$-oriented wafers. Opposite faces on an $\{1\ 0\ -1\ -1\}$-oriented seed crystal or plate constitute different planes, so use of such a seed crystal alone can produce growth in two distinct crystallographic growth sectors. Growth in a single crystallographic growth sector may be achieved by stacking pairs of $\{1\ 0\ -1\ -1\}$-oriented seed crystals or plates back to back, with the $\{1\ 0\ -1\ 1\}$-oriented faces facing one another. The pairs of seed crystals may be placed in direct contact with one another or could be separated by a crystal separator plate. If the pairs of seed crystals or plates grow together during a growth run they may be separated after the run, if desired, or may be left together for use as a seed (bi-)crystal in a subsequent run. A $\{1\ 0\ -1\ -1\}$-oriented bi-crystal, on which both large-area faces constitute $\{1\ 0\ -1\ -1\}$ surfaces, is suitable for use as a seed crystal, as growth on the large area faces will occur in only a single crystallographic direction. At least one contact twin, stacking fault, grain boundary, or other boundary, oriented substantially parallel to the large-area surfaces, may be present in the bi-crystal. Schematic illustrations of a bi-crystal are shown in FIG. 4B, where the alternative shadings indicate grains that are separated by a twin, grain boundary, or other boundary. The growing surfaces may be flat, as represented in FIG. 4B, or bi-faceted, as shown in FIG. 6 and described further below. In certain embodiments, the back sides of the pairs of seed crystals may be wafer-bonded together, for example, using techniques described in U.S. Publication No. 2012/0000415, which is incorporated by reference in its entirety.

In certain embodiments, manufacturing growth is desired to occur predominantly on the semipolar $\{6\ 0\ -6\ \pm1\}$ plane, the $\{5\ 0\ -5\ \pm1\}$ plane, the $\{4\ 0\ -4\ \pm1\}$ plane, the $\{3\ 0\ -3\ \pm1\}$ plane, the $\{5\ 0\ -5\ \pm2\}$ plane, the $\{2\ 0\ -2\ \pm1\}$ plane, the $\{3\ 0\ -3\ \pm2\}$ plane, the $\{4\ 0\ -4\ \pm3\}$ plane, or the $\{5\ 0\ -5\ \pm4\}$ plane. Growth on these semipolar planes may be desired for improved device performance, improved crystallographic quality, reduced impurity incorporation, or, conversely, by increased capability for incorporation of dopants or band-gap modifiers such as Al or In. Growth perpendicular to the $\{6\ 0\ -6\ \pm1\}$, $\{5\ 0\ -5\ \pm1\}$, $\{4\ 0\ -4\ \pm1\}$, $\{3\ 0\ -3\ \pm1\}$, $\{5\ 0\ -5\ \pm2\}$, $\{2\ 0\ -2\ \pm1\}$, $\{3\ 0\ -3\ \pm2\}$, $\{4\ 0\ -4\ \pm3\}$, or $\{5\ 0\ -5\ \pm4\}$ planes may also be suitable for producing $\{6\ 0\ -6\ \pm1\}$, $\{5\ 0\ -5\ \pm1\}$, $\{4\ 0\ -4\ \pm1\}$, $\{3\ 0\ -3\ \pm1\}$, $\{5\ 0\ -5\ \pm2\}$, $\{2\ 0\ -2\ \pm1\}$, $\{3\ 0\ -3\ \pm2\}$, $\{4\ 0\ -4\ \pm3\}$, or $\{5\ 0\ -5\ \pm4\}$-oriented wafers. Opposite faces on a $\{6\ 0\ -6\ \pm1\}$, $\{5\ 0\ -5\ \pm1\}$, $\{4\ 0\ -4\ \pm1\}$, $\{3\ 0\ -3\ \pm1\}$, $\{5\ 0\ -5\ \pm2\}$, $\{2\ 0\ -2\ \pm1\}$, $\{3\ 0\ -3\ \pm2\}$, $\{4\ 0\ -4\ \pm3\}$, or $\{5\ 0\ -5\ \pm4\}$-oriented seed crystal or plate constitute different planes, so use of such a seed crystal alone may produce growth in two distinct crystallographic growth sectors. In certain embodiments, growth in a single crystallographic growth sector is achieved by stacking pairs of {6 0 –6 –1}-, {5 0 –5 –1}-, {4 0 –4 –1}-, {3 0 –3 –1}-, {5 0 –5 –2}-, {2 0 –2 –1}-, {3 0 –3 –2}-, {4 0 –4 –3}-, or {5 0 –5 –4}-oriented seed crystals or plates back to back, with the {6 0 –6 1}-, {5 0 –5 1}-, {4 0 –4 1}-, {3 0 –3 1}-, {5 0 –5 2}-, {2 0 –2 1}-, {3 0 –3 2}-, {4 0 –4 3}-, or {5 0 –5 4}-oriented faces facing one another. The pairs of seed crystals may be placed in direct contact with one another or may be separated by a crystal separator plate. If the pairs of seed crystals or plates grow together during a growth run they may be separated after the run, if desired, or may be left together for use as a seed (bi-) crystal in a subsequent run. A {6 0 –6 –1}-, {5 0 –5 –1}-, {4 0 –4 –1}-, {3 0 –3 –1}-, {5 0 –5 –2}-, {2 0 –2 –1}-, {3 0 –3 –2}-, {4 0 –4 –3}-, or {5 0 –5 –4}-oriented bi-crystal, in which both outward-facing large-area faces constitute {6 0 –6 –1}-, {5 0 –5 –1}-, {4 0 –4 –1}-, {3 0 –3 –1}-, {5 0 –5 –2}-, {2 0 –2 –1}-, {3 0 –3 –2}-, {4 0 –4 –3}-, or {5 0 –5 –4} surfaces, is suitable for use as a seed crystal, as growth on the large area faces will occur in only a single crystallographic direction. At least one contact twin, stacking fault, grain boundary, or other boundary, oriented substantially parallel to the large-area surfaces, may be present in the bi-crystal. In other embodiments, growth in a single crystallographic growth sector is achieved by stacking pairs of {6 0 –6 1}-, {5 0 –5 1}-, {4 0 –4 1}-, {3 0 –3 1}-, {5 0 –5 2}-, {2 0 –2 1}-, {3 0 –3 2}-, {4 0 –4 3}-, or {5 0 –5 4}-oriented seed crystals or plates back to back, with the {6 0 –6 –1}, {5 0 –5 –1}, {4 0 –4 –1}, {3 0 –3 –1}, {5 0 –5 –2}, {2 0 –2 –1}, {3 0 –3 –2}, {4 0 –4 –3}, or {5 0 –5 –4}-oriented faces facing one another. The pairs of seed crystals may be placed in direct contact with one another or may be separated by a crystal separator plate. If the pairs of seed crystals or plates grow together during a growth run they may be separated after the run, if desired, or may be left together for use as a seed (bi-) crystal in a subsequent run. A {6 0 –6 1}-, {5 0 –5 1}-, {4 0 –4 1}-, {3 0 –3 1}-, {5 0 –5 2}-, {2 0 –2 1}-, {3 0 –3 2}-, {4 0 –4 3}-, or {5 0 –5 4}-oriented bi-crystal, in which both outward-facing large-area faces constitute {6 0 –6 1}, {5 0 –5 1}, {4 0 –4 1}, {3 0 –3 1}, {5 0 –5 2}, {2 0 –2 1}, {3 0 –3 2}, {4 0 –4 3}, or {5 0 –5 4} surfaces, is suitable for use as a seed crystal, as growth on the large area faces will occur in only a single crystallographic direction. At least one contact twin, stacking fault, grain boundary, or other boundary, oriented substantially parallel to the large-area surfaces, may be present in the bi-crystal.

In certain embodiments, manufacturing growth is desired to occur predominantly on semipolar planes. Semipolar planes may be designated by (h k i l) Miller indices, where i=–(h+k), l is nonzero and at least one of h and k are nonzero. For example, growth on (1 0 –1 –1) planes may be desired over growth on (1 0 –1 1) planes because of a higher growth rate, improved crystallographic quality, reduced impurity incorporation, or, conversely, by increased capability for incorporation of dopants or band-gap modifiers such as Al or In. Growth in semipolar directions may be ideal for producing semipolar-oriented wafers. Opposite faces on a semipolar oriented seed crystal or plate constitute different planes, so use of such a seed crystal alone would produce growth in two distinct crystallographic growth sectors. Growth in a single crystallographic growth sector may be achieved by stacking pairs of semipolar-oriented seed crystals or plates back to back, with like faces facing one another. For example, the (1 0 –1 1) face of two semipolar seed crystals or plates may be faced proximate to one another, so that the (1 0 –1 –1) faces of the two seed crystals or plates face outward and yield growth in a single crystallographic orientation. More generally, the (h k i l) face of two semipolar seed crystals or plates may be placed proximate to one another, so that the (h k i –l) faces of the two seed crystals or plates face outward and yield growth in a single crystallographic orientation. The pairs of seed crystals may be placed in direct contact with one another or may be separated by a crystal separator plate. If the pairs of seed crystals or plates grow together during a growth run they may be separated after the run, if desired, or may be left together for use as a seed (bi-)crystal in a subsequent run. A semipolar bi-crystal, on which both large-area faces constitute the same semipolar orientation, is suitable for use as a seed, as growth on the large area faces will occur in only a single crystallographic direction.

In certain embodiments, semipolar seed crystals may be placed back to back to each other, with the outward-facing surfaces having substantially the same crystallographic orientation as one another, by means of wafer bonding, die bonding, or the like. Similarly, the inward-facing surfaces of pairs of semipolar seed crystals may have substantially the same crystallographic orientation as one another (and different than the respective outward-facing surfaces). For example, the back sides of the crystals may be coated with one or more of gold, titanium-gold, silicon-gold, gold-tin, gold-indium, copper-tin, gold-germanium, aluminum-germanium, nickel, titanium, chromium, rhodium, ruthenium, copper, aluminum, a metal nitride, silica ($SiO_2$), or the like, placed into contact with one another, and heated and/or pressed against one another to form a bond.

In certain embodiments, particularly when the seed or seed plate constitutes a bi-crystal or a wafer- or die-bonded composite of two crystals, one or more edges of the crystal or crystals may be passivated so as to avoid undesirable growth, for example, rapid growth of a crystal with a re-entrant twin or of a polycrystal, during an ammonothermal crystal growth process. In certain embodiments, at least one edge may be coated with at least one of nickel, chromium, titanium, gold, platinum, or silver, for example, by thermal evaporation, electron-beam evaporation, sputtering, or the like.

In certain embodiments, manufacturing growth of nominally non-polar, m-plane crystals is desired to occur predominantly on planes having a miscut, such as about 0.5 degree to about 5 degrees toward the +c [0001], –c [000-1], or a <11-20> directions. Such an orientation is actually semipolar and the front and back of parallel faces of such a seed crystal will not be crystallographically equivalent. For example, if the front face of a parallel-faced seed is miscut by 5 degrees from m toward +c, the back face will be miscut by 5 degrees from m toward –c. This problem can be avoided by having both the front and back large-area surfaces of the seed cut to expose substantially the same crystallographic orientation, thereby producing a wedge angle between the front and back surfaces, rather than cutting such that the surfaces are parallel. For example, both sides of a seed may be cut 3 degrees from m toward –c, with a 6-degree wedge angle between the front and back surfaces, rather than cutting them parallel.

The miscut angle on either or both sides of a non-polar m-plane seed crystal may be less than about 5 degrees, less than about 2 degrees, or less than about 1 degree toward the –c [000-1] direction. The miscut angle on either or both sides of a non-polar m-plane seed crystal may be less than about 1 degree, less than about 0.5 degree, less than about 0.2 degree, or less than about 0.1 degree toward the <11-20> a direction. The miscut angle on at least one side of a non-polar m-plane seed crystal may between about 0 and about 2 degrees, or between about 0 and about 1 degree, between on-axis <10-10> m-plane and the [0001] +c direction.

Figure 6A:
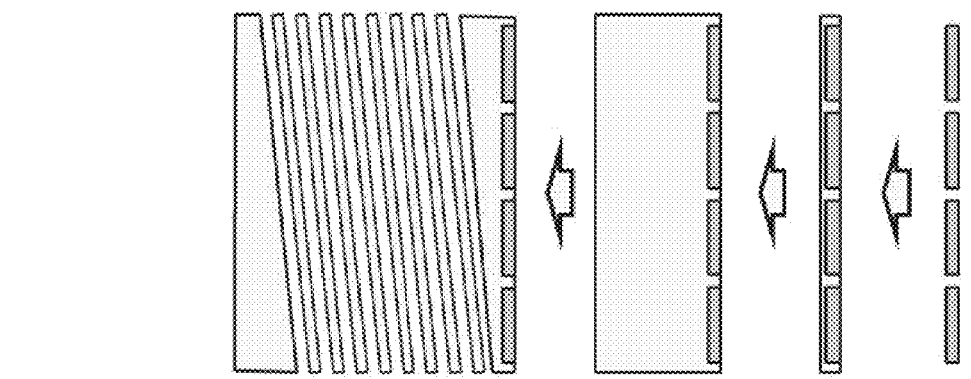
FIG. 6A, FIG. 6B, and FIG. 6C are simplified diagrams illustrating methods for growth of thick boules and subsequent wafering according to embodiments of the present disclosure.

In certain embodiments, the semipolar plane of interest is stable under ammonothermal growth conditions. For example, in many cases the {1 0 −1 −1} planes are stable, and under other conditions the {1 0 −1 1} planes are stable. In such a case thick boules may be grown and wafers prepared by sawing parallel to the large area surfaces of the boule, as shown in FIG. 6A. For brevity, growth on only one side of one or more seed crystals is shown. Growth on the back-side may be achieved without growing on symmetry-non-equivalent orientations by use of bi-crystals, wafer- or die-bonded crystals, or back-to-back mounted crystals, as described above. In certain embodiments, the back side of the seed crystals is simply masked to inhibit or prevent growth. For example, the back sides of the crystals may be coated with one or more layers having a composition comprising one or more of gold, titanium-gold, silicon-gold, gold-tin, gold-indium, copper-tin, gold-germanium, aluminum-germanium, nickel, titanium, chromium, tungsten, tantalum, niobium, molybdenum, rhenium, rhodium, ruthenium, copper, aluminum, platinum, silver, a metal nitride, silica ($SiO_2$), or the like, or may be placed proximate to or in contact with a plate. The one or more layers may comprise one or more of an adhesion layer, a diffusion barrier layer, and an inert layer. In certain embodiments, the seed crystals or plates 6A00 in FIG. 6A may comprise a precisely-tiled mosaic of seed crystals, as represented by the bottom row in FIG. 6A and described in U.S. Publication No. 2012/0000415, which is incorporated by reference in its entirety.

Figure 7:
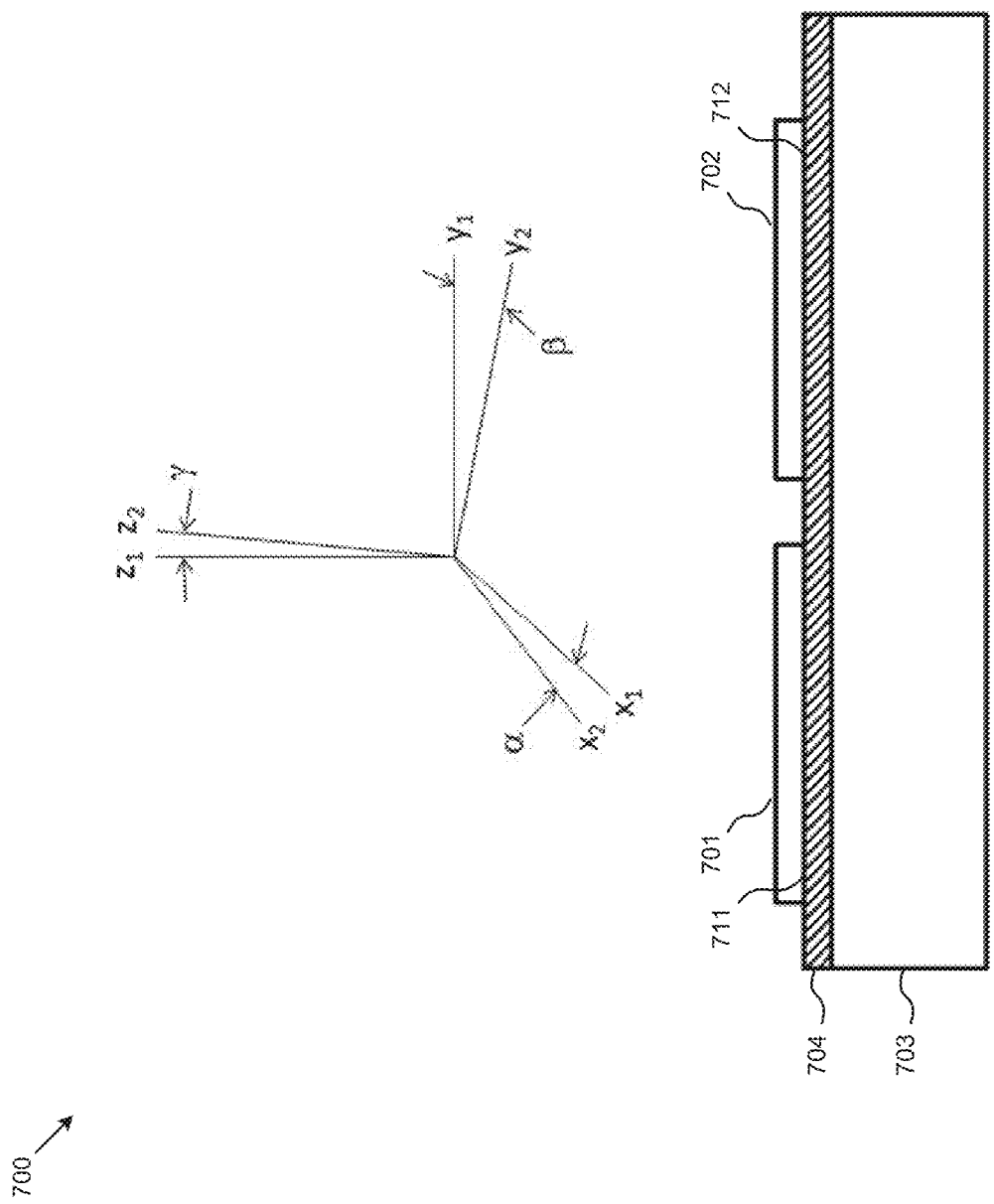
FIG. 7 is a simplified diagram illustrating the crystallographic misorientation between two adjacent wafer-bonded crystals according to an embodiment of the present disclosure.

FIG. 7 shows diagram 700 with a first nitride crystal 701 and a second nitride crystal 702 bonded to a handle substrate 703 by means of an adhesion layer 704. Coordinate system 721 ($x_1$ $y_1$ $z_1$) represents the crystallographic orientation of the first nitride crystal 701, where $z_1$ is the negative surface normal of the nominal orientation of surface 711 and $x_1$ and $y_1$ are vectors that are orthogonal to $z_1$. For example, if surface 711 has a (0 0 0 1) orientation, then $z_1$ is a unit vector along [0 0 0 −1], and $x_1$ and $y_1$ may be chosen to be along [1 0 −1 0] and [1 −2 1 0], respectively. If surface 711 of first nitride crystal 701 has a (1 0 −1 0) orientation, then $z_1$ is a unit vector along [−1 0 1 0] and $x_1$ and $y_1$ may be chosen to be along [1-2 1 0] and [0 0 0 1], respectively. Similarly, coordinate system 722 ($x_2$ $y_2$ $z_2$) represents the crystallographic orientation of the second nitride crystal 702, where $z_2$ is the negative surface normal of the nominal orientation of surface 712 of second nitride crystal 702 and $x_2$ and $y_2$ are vectors that are orthogonal to $z_2$, where the same convention is used for the crystallographic directions corresponding to ($x_2$ $y_2$ $z_2$) as for ($x_1$ $y_1$ $z_1$). The crystallographic misorientation between the first nitride crystal and the second nitride crystal may be specified by the three angles $\alpha$, $\beta$, and $\gamma$, where $\alpha$ is the angle between $x_1$ and $x_2$, $\beta$ is the angle between $y_1$ and $y_2$, and $\gamma$ is the angle between $z_1$ and $z_2$. Because the surface orientations of the first and second nitride crystals are nearly identical, the polar misorientation angle $\gamma$ is very small, for example, less than 0.5 degree, less than 0.2 degree, less than 0.1 degree, less than 0.05 degree, less than 0.02 degree, or less than 0.01 degree. Because of the precise control in the orientation of the nitride crystal during placement, the misorientation angles $\alpha$ and $\beta$ are also very small, for example, less than 1 degree, less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The crystallographic misorientation between additional, adjacent nitride crystals is similarly very small. In certain embodiments, the polar misorientation angle $\gamma$ between adjacent nitride crystals may be less than 0.5 degree and the azimuthal misorientation angles $\alpha$ and $\beta$ between adjacent nitride crystals may be less than 1 degree.

In certain embodiments, each of a plurality of seed plates comprises a single crystal or a crystal comprising one or more low-angle grain boundaries, as may be formed by coalescence of precisely-oriented tile crystals. Such a single crystal seed is indicated by the second row from the bottom in FIG. 6A.

In certain embodiments, as illustrated schematically by the third- and fourth-from-bottom rows in FIG. 6A, each of a plurality of semipolar seed crystals is grown into a thick boule and then sliced or sectioned approximately parallel to the growth plane. The thickness of the grown boule may be between about 0.5 millimeter and about 50 millimeters, or between about 2 millimeters and about 25 millimeters. The slicing, sectioning, or sawing may be performed by methods that are known in the art, such as internal diameter sawing, outer diameter sawing, fixed abrasive multiwire sawing, fixed abrasive multiblade sawing, multiblade slurry sawing, multiwire slurry sawing, ion implantation and layer separation, or the like. The wafers may be lapped, polished, and chemical-mechanically polished according to methods that are known in the art.

In certain embodiments, a least one surface-control additive is added to the ammonothermal growth environment in order to stabilize a desired semipolar growth orientation. For example, various types of additives have been shown to stabilize different crystal habits/orientations during hydrothermal growth ((a) Eremina, et al., "On the mechanism of impurity influence on growth kinetics of KDP crystals—II: experimental study of influence of bivalent and trivalent ions on growth kinetics and surface morphology of KDP crystals," J. Cryst. Growth 273, 586 (2005); (b) Wang, et al., "Hydrothermal growth and characterization of indium-doped-conducting ZnO crystals," J. Cryst. Growth 304, 73 (2007)). In the case of growth of gallium-containing nitride crystals, the surface control additive may comprise at least one of an alkali metal, an alkaline earth metal, a transition metal, a rare earth metal, B, C, O, Al, Si, P, S, Ge, As, Se In, Sn, Sb, Te, Tl, Pb, Bi, or Po.

In certain embodiments, the opposite face of a stable-growing orientation, for example, {1 0 −1 1}, may be prepared by growing in the <1 0 −1 −1> direction and polishing the back sides of the wafers rather than the front sides.

Figure 6B:
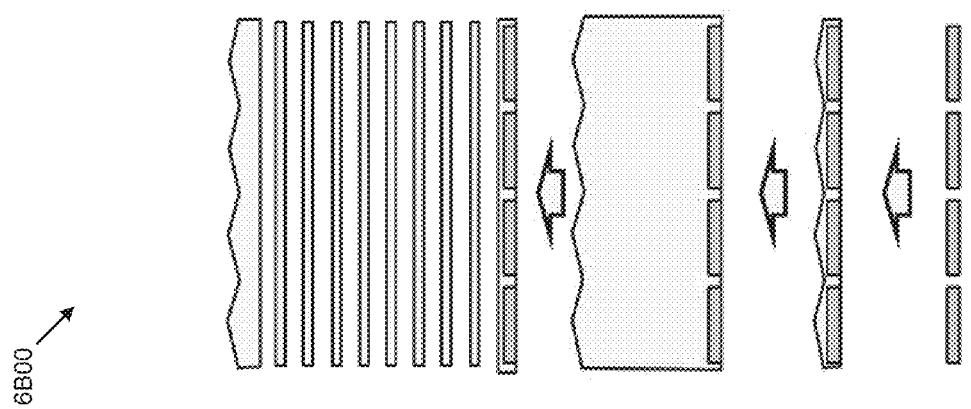

In certain embodiments, shown schematically in FIG. 6B, stable facets form at orientations that are oblique with respect to the desired semipolar orientation. This scenario may apply, for example, to orientations intermediate between m-plane and {1 0 −1 −1} such as {2 0 −2 −1} or its backside, (2 0 −2 1). The bi-faceted morphology persists during growth into a boule and the boule is sliced approximately parallel to the desired semipolar orientation. In certain embodiments, the seed crystals or plates 6B00 in FIG. 6B may comprise a precisely-tiled mosaic of seed crystals, as represented by the bottom row in FIG. 6B and described in U.S. Publication No. 2012/0000415. In certain embodiments, a pattern of parallel grooves may be formed on the surface of a seed crystal in order to initiate bi-faceted growth. The grooves may be formed by sawing, dry etching, reactive ion etching, wet etching, laser scribing, grinding, or the like. The grooves may have a depth between about 1 micrometer and about 1 millimeter, or between about 10 micrometers and about 300 micrometers. The grooves may have a width between about 10 micrometers and about 1 millimeter. The grooves may be oriented to be substantially parallel to the [000±1] ±c-direction. In certain embodiments, a pattern of parallel mask lines are formed on the surface of a crystal in order to initiate bi-faceted growth. The mask lines may comprise at least one of nickel, chromium, titanium, gold, molybdenum, tungsten, tantalum, niobium, rhenium, platinum, rhodium, ruthenium, or silver and may be deposited, for example, by thermal evaporation, electron-beam evaporation, sputtering, or the like. The mask lines may comprise more than one layer, for example, an adhesion layer, a diffusion barrier layer, and an inert layer. The mask lines may have a thickness between about 0.01 micrometer and about 100 micrometers and may have a width between about 10 micrometers and about 10 millimeters. The period of the grooves, or of the lines, or of the mosaic of tile crystals, may be between about 0.01 millimeter and about 10 centimeters, between about 0.1 millimeter and about 50 millimeters, or between about 1 millimeter and about 10 millimeters. The mask lines may be oriented to be substantially parallel to the [000±1] ±c-direction.

Figure 8:
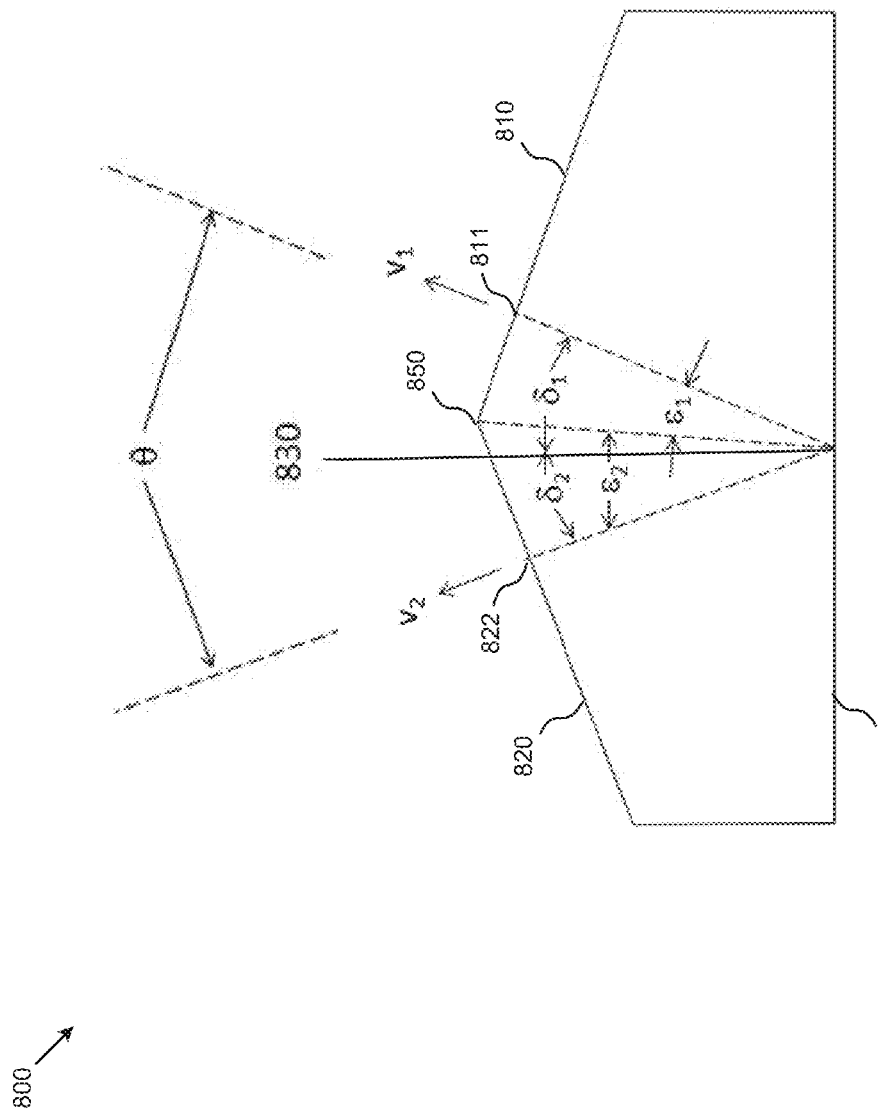
FIG. 8 is a simplified diagram showing bi-faceted growth of a semipolar orientation intermediate between two stable growth orientation, according to embodiments of the present disclosure.

The bi-faceted growth of each segment of one surface of the boule is shown schematically in FIG. 8, diagram 800. Surface normal 830 to a desired semipolar orientation 840 is misoriented by angle $\delta_1$ with respect to normal 811 of facet 810, which grows stably under a given growth condition and by angle $\delta_2$ with respect to normal 822 of facet 820, which also grows stably under the same growth condition. The growth front of apex 850 between facets 810 and 820 is misoriented by angle $\varepsilon_1$ with respect to normal 811 of facet 810 and by angle $\varepsilon_2$ with respect to normal 822 of facet 820. The sums $\delta_1+\delta_2$ and $\varepsilon_1+\varepsilon_2$ are each equal to the angle $\theta$ between facets 810 and 820, which is determined by the crystal structure of the gallium-containing nitride crystal and the identities of the stable growth facets. Angle $\theta$ may be between about 20 degrees and about 75 degrees. The propagation direction of the growth front apex 850 in relation to desired semipolar surface normal 830 is determined by $\theta$ and by the growth velocities (growth rates) $v_1$ and $v_2$ of growth facets 810 and 820, respectively. In differential time dt facets 810 and 820 advance by distances $v_1 dt$ and $v_2 dt$, respectively, and apex 850 advances by $v_1 dt/\cos \varepsilon_1 = v_2 dt/\cos \varepsilon_2$. Solving this latter equation and recalling that $\varepsilon_2 = \theta - \varepsilon_1$, we conclude that the apex angle is given by equation (1):

$$\varepsilon_1 = \tan^{-1}[(x-\cos \theta)/\sin \theta] \quad (1)$$

where $x = v_2/v_1$ is the ratio of the growth rates of facets 820 and 810. In certain embodiments the growth rate ratio x is maintained between about 1/5 and about 5, between about 1/3 and about 3, between about 1/2 and about 2, or between about 3/4 and about 4/3.

Propagation of the apices, and of the valleys between adjacent apices, occurs at angle $\varepsilon_1$ with respect to normal 811 of facet 810, at rate $v_1/\cos \varepsilon_1 = v_2/\cos \varepsilon_2$. The net, one-sided, growth rate of the valleys in the direction of surface normal 830, which defines the rate at which the waferable boule grows, is then $v = v_1 \cos(\delta_1 - \varepsilon_1)/\cos(\varepsilon_1)$.

In certain embodiments, growth of semipolar orientations of GaN intermediate between m-plane and {1 0 -1 -1}, growth facet 810 may be m-plane, growth facet 820 may be (1 0 -1 -1) and $\theta=28.04$ degrees. Values of $\delta_1$ are given for several semipolar planes in Table 1, and values of $\varepsilon_1$ and of the growth rate ratio, $v/v_{(10-10)}$, are given for several (1 0 -1 -1)-to-m-plane growth rate ratios x and semipolar planes in Table 2. The values for $\delta_1$ assume that the nominal semipolar plane is prepared precisely on-axis. Specifications for miscut of the semipolar orientations of large area seed crystals are described below.

TABLE 1

Orientations of several GaN semipolar planes with respect to m-plane.

| Semipolar plane | Angle to m-plane ($\delta_1$ in FIG. 8), degrees |
|---|---|
| (6 0 -6 -1) | 5.07 |
| (5 0 -5 -1) | 6.08 |
| (4 0 -4 -1) | 7.58 |
| (3 0 -3 -1) | 10.07 |
| (5 0 -5 -2) | 12.03 |
| (7 0 -7 -3) | 12.86 |
| (2 0 -2 -1) | 14.91 |
| (3 0 -3 -2) | 19.55 |
| (4 0 -4 -3) | 21.77 |
| (5 0 -5 -4) | 23.08 |
| (1 0 -1 -1) | 28.04 |

TABLE 2

Apex orientation $\varepsilon_1$ with respect to m-plane, semipolar plane orientation $\delta_1$ with respect to m-plane, and bi-faceted growth rate $v/v_{(10-10)}$ as a function of the ratio of growth rates perpendicular to (1 0 -1 -1) and to (1 0 -1 0) $v_{(10-1-1)}/v_{(10-10)}$ for selected semipolar planes intermediate between m-plane and (1 0 -1 -1) during bi-faceted m-plane and (1 0 -1 -1) growth.

| | | $\delta_1$ (°) | | | | | | | |
|---|---|---|---|---|---|---|---|---|---|
| $v_{(10-1-1)}/v_{(10-10)}$ | $\varepsilon_1$ (°) | (60-6-1) 5.07 | (50-5-1) 6.08 | (40-4-1) 7.58 | (30-3-1) 10.07 | (50-5-2) 12.03 | (20-2-1) 14.91 | (30-3-2) 19.55 | (40-4-3) 21.77 | (50-5-4) 23.08 |
| 0.33 | -49.44 | 0.89 | 0.87 | 0.84 | 0.78 | 0.73 | 0.67 | 0.55 | 0.50 | 0.46 |
| 0.40 | -45.75 | 0.91 | 0.89 | 0.86 | 0.81 | 0.76 | 0.70 | 0.60 | 0.55 | 0.52 |
| 0.50 | -39.14 | 0.92 | 0.91 | 0.88 | 0.84 | 0.81 | 0.76 | 0.67 | 0.63 | 0.60 |
| 0.67 | -24.67 | 0.96 | 0.95 | 0.93 | 0.90 | 0.88 | 0.85 | 0.79 | 0.76 | 0.74 |
| 0.75 | -15.75 | 0.97 | 0.96 | 0.95 | 0.94 | 0.92 | 0.89 | 0.85 | 0.82 | 0.81 |
| 0.80 | -9.97 | 0.98 | 0.98 | 0.97 | 0.95 | 0.94 | 0.92 | 0.88 | 0.86 | 0.85 |
| 1.00 | 14.02 | 1.02 | 1.02 | 1.02 | 1.03 | 1.03 | 1.03 | 1.03 | 1.02 | 1.02 |
| 1.25 | 38.01 | 1.07 | 1.08 | 1.09 | 1.12 | 1.14 | 1.17 | 1.20 | 1.22 | 1.23 |
| 1.33 | 43.79 | 1.08 | 1.10 | 1.12 | 1.15 | 1.18 | 1.21 | 1.26 | 1.28 | 1.30 |
| 1.50 | 52.71 | 1.11 | 1.13 | 1.16 | 1.21 | 1.25 | 1.30 | 1.38 | 1.42 | 1.43 |
| 2.00 | 67.18 | 1.21 | 1.25 | 1.30 | 1.40 | 1.47 | 1.58 | 1.74 | 1.81 | 1.85 |
| 2.50 | 73.79 | 1.30 | 1.36 | 1.45 | 1.59 | 1.69 | 1.85 | 2.09 | 2.20 | 2.27 |
| 3.00 | 77.48 | 1.39 | 1.47 | 1.59 | 1.77 | 1.92 | 2.13 | 2.45 | 2.60 | 2.69 |

Table 2 shows that for semipolar orientations relatively close to m-plane the net boule growth rate during bi-faceted growth is close to that of m-plane for a wide range of growth-rate ratios $v_{(10-1-1)}/v_{(10-10)}$. For semipolar orientations closer to (1 0 −1 −1) the net boule growth rate is closer to that of (1 0 −1 −1) but remains favorable.

In addition to the quasi one-dimensional, bi-faceted growth front shown schematically in FIG. 6B, additional facets may be present during growth. However, in certain embodiments, two and only two non-crystallographically-equivalent facets cover more than 80%, more than 90%, more than 95%, or in certain embodiments, more than 98% of the surface of the growing crystals. In certain embodiments, these two non-crystallographically-equivalent orientations constitute m-plane and {1 0 −1 −1}.

Impurity uptake generally varies by crystallographic orientation, and bi-faceted growth might be expected to produce large variations in impurity content, possibly generating stresses, cracking, and other undesirable features. For example, Czernetzki et al. (Phys. Status Solidi (a) 200, 9 (2003)) reported that oxygen uptake is considerably greater in the (0 0 0 −1) growth sector than in the (0 0 0 1) growth sector, which can give rise to strain and a bowing radius as small as 0.1 meter. Motoki et al. (U.S. Publication No. 2002/0189532) disclose that oxygen uptake during m-plane growth is 50 times higher than that during c-plane growth under similar conditions.

Surprisingly, we find that impurity uptake, including oxygen, during m-plane and {1 0 −1 −1} bi-faceted semipolar growth produces only modest impurity variations and does not give rise to undesirable stresses or cracking. Based on previous reports, for example, one might have expected deviations by a factor of 50 or more in the impurity concentrations in m-plane versus {1 0 −1 −1} growth sectors. Also, surprisingly, we find that both m-plane and {1 0 −1 −1} uptake mineralizer impurities at a significantly higher rate than c-plane but at relatively similar rates to one another.

Boules grown by bi-faceted growth, and wafers sliced from such boules, may contain impurities comprising at least one of O, H, Li, Na, K, F, Cl, Br, I, Si, Ge, Cu, Mn, or Fe, at a concentration between about $1 \times 10^{16}$ cm$^{-3}$ and about $1 \times 10^{20}$ cm$^{-3}$, or between about $1 \times 10^{17}$ cm$^{-3}$ and about $1 \times 10^{19}$ cm$^{-3}$. The impurity distribution may comprise at least 4 bands, at least 8 bands, or at least 16 bands of alternating higher and lower concentrations, where the higher impurity concentration is higher, by a factor of between about 1.05 and about 40, between about 1.05 and about 10, between about 1.1 and about 5, or between about 1.1 and about 2, than the lower impurity concentration. The bands of alternating higher and lower impurity concentration may have a periodic distribution in a direction parallel to the surface, with a period between about 0.01 millimeter and about 10 centimeters, between about 0.1 millimeter and about 50 millimeters, or in certain embodiments, between about 1 millimeter and about 10 millimeters. The ammonothermally-grown gallium-containing nitride crystal may be characterized by a wurzite structure substantially free from any cubic entities and have an optical absorption coefficient of about 10 cm$^{-1}$, 5 cm$^{-1}$, 2 cm$^{-1}$, 1 cm$^{-1}$, or 0.5 cm$^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure.

In certain embodiments, the dislocation density at the large-area surfaces of the seed plates is less than about $10^6$ cm$^{-2}$. In certain embodiments, the dislocation density at the large-area surfaces of the seed plates is less than about $10^5$ cm$^{-2}$, less than about $10^4$ cm$^{-2}$, less than about $10^3$ cm$^{-2}$, or less than about $10^2$ cm$^{-2}$. In certain embodiments, the full width at half maximum of the symmetric x-ray rocking curve corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds. In certain embodiments, the full width at half maximum of the lowest-order asymmetric x-ray rocking curve associated with the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds. In certain embodiments, the average dislocation density across a large-area surface of a seed plate is less than about $10^7$ cm$^{-2}$, less than about $10^6$ cm$^{-2}$, less than about $10^5$ cm$^{-2}$, or less than about $10^4$ cm$^{-2}$.

The bi-faceted growth front remains stable after coalescence of the tile crystals and enables growth of a "hockey puck" crystal, albeit one with a macro-facetted surface. The thickness of the boule may be between about 0.5 millimeter and about 50 millimeters, or between about 2 millimeters and about 10 millimeters. The diameter of the boule may be between about 5 millimeters and about 300 millimeters, or between about 25 millimeters and about 150 millimeters. The boule may be sliced approximately parallel to the net growth direction as shown in FIG. 6B. The bi-faceted morphology may remain in the topmost wafer and this wafer may be used as a seed crystal for the next run. Bi-faceted growth enables growth of large-diameter semipolar boules without the requirement of growing the boules thick enough to slice at an oblique angle (cf. FIG. 6C). Growing thinner boules may enable improved reactor throughput, for example, via the ability to load a greater number of seeds, improved crystal quality, or the like. Furthermore, for a particular boule thickness, the bi-faceted growth mode may enable higher yield of a particular orientation of semipolar wafers as compared to slicing boules at an oblique angle (cf. FIG. 6C).

Figure 6C:
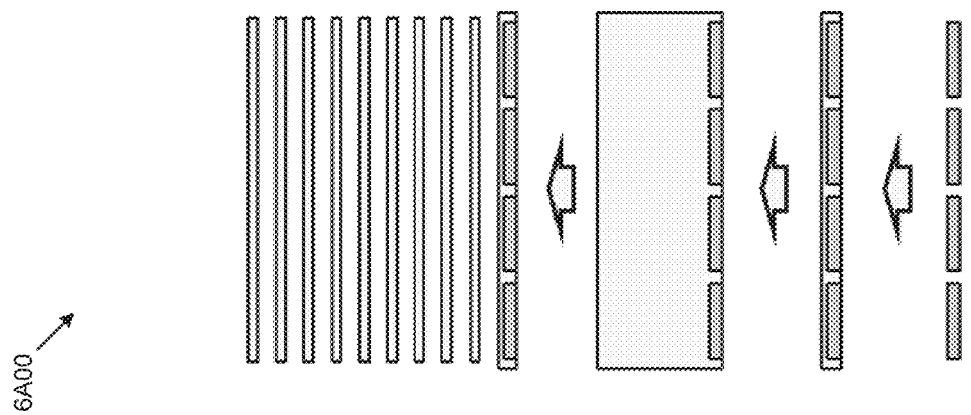

In certain embodiments, as illustrated schematically in FIG. 6C, boule growth is performed in an oblique orientation with respect to the semipolar wafer orientation. Such a scheme can be applied to essentially any semipolar orientation, and may be the optimum approach when the desired orientation is neither stable nor gives rise to a bi-faceted morphology. In this case, the ends of the boule yield wedge-shaped crystals after wafering. Residual wedge-shaped crystals may be used as seeds or as nutrient in subsequent growth runs.

Figure 9:
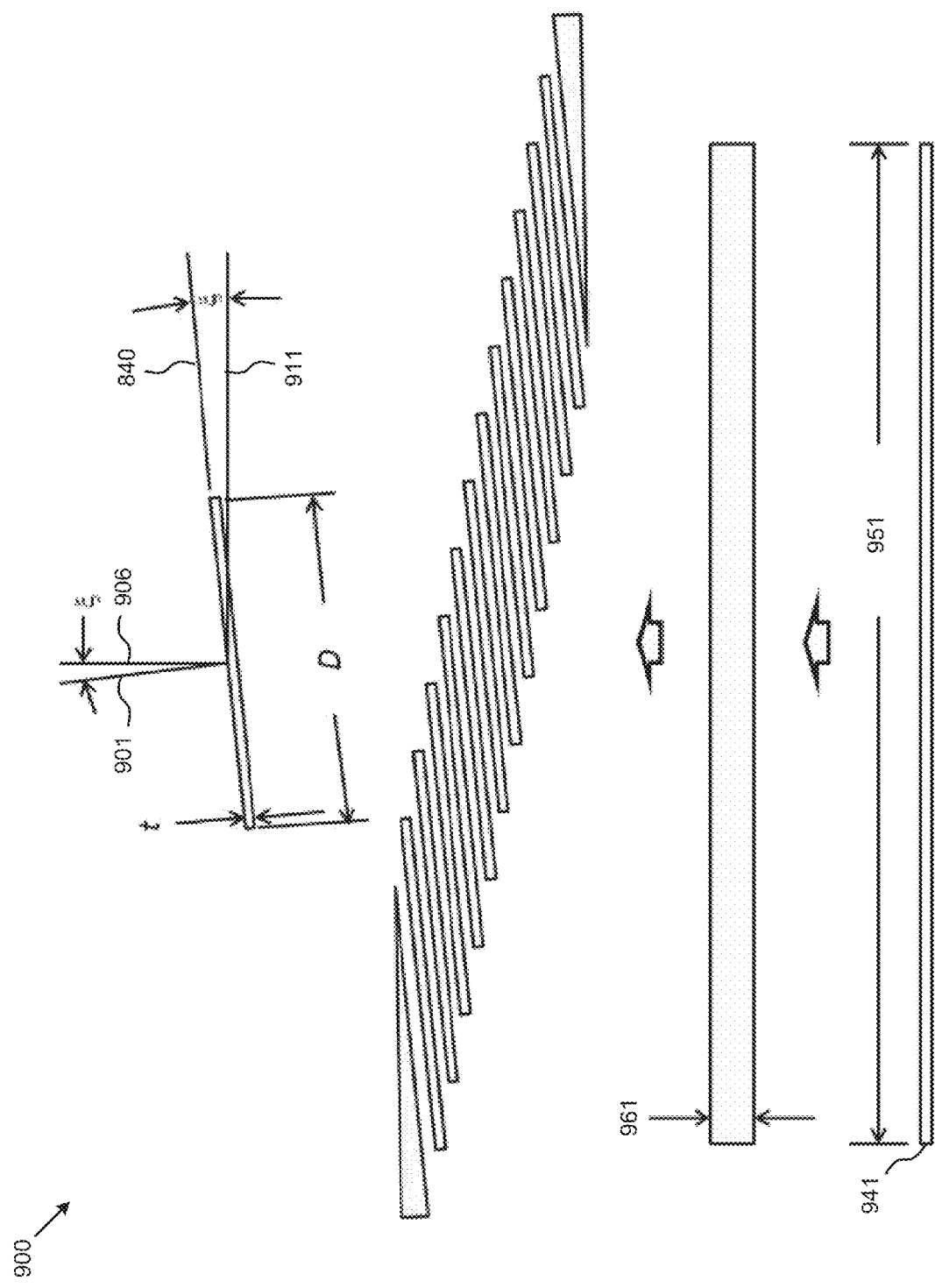
FIG. 9 is a simplified illustrating a method for growth of thick boules and subsequent wafering according to embodiments of the present disclosure.

In certain embodiments, as illustrated schematically in FIG. 9, diagram 900, the seeds or seed plates have a maximum lateral dimension that is substantially greater than the target diameter D of semipolar wafers having thickness t. For example, surface normal 901 to the desired semipolar plane may be tilted by angle 4 with respect to direction 906 of stable boule growth, where ζ is between about 5 degrees and about 60 degrees. Expressed differently, desired semipolar orientation 840 may be tilted by angle ζ with respect to stable growth plane 911. In order to be able to slice wafers of the desired orientation by growth in direction 906, seed 941 can be grown to a thickness 961 of at least D sin ζ+t+w, where w is the kerf loss associated with slicing and polishing. In certain embodiments, seeds 941 are provided having a maximum dimension 951 that is between about 2D and about 10D. In certain embodiments, seeds 941 are grown to a thickness between about D sin ζ and about 1.5 D sin ζ or between about D sin ζ and about 1.1 D sin ζ. The width of the seed out of the plane in FIG. 9 may be between about D and about 1.2 D. In certain embodiments D is between about 25 millimeters and about 300 millimeters. In certain embodiments stable growth plane 911 is selected from (0 0 0 1), (0 0 0 −1), {1 0 −1 0}, {1 0 −1 1}, and {1 0 −1 −1}.

Epitaxial growth of III-nitride materials on a GaN substrate can be sensitive to miscut with respect to a nominal crystallographic orientation. For example, Hirai et al. (Appl. Phys. Lett. 91, 191906 (2007)) disclose epitaxial GaN layers and LED structures by metalorganic chemical vapor deposition (MOCVD) on m-plane substrates that were on-axis or were miscut by 0.2°, 0.5°, 2°, or 5° in the a-direction or by 0.45°, 5.4°, or 9.7° in the −c-direction. They found that the surface morphology of the on-axis structures was dominated by pyramidal hillocks, and that the hillocks could be largely eliminated by increasing the miscut angle to 0.5° or greater. However, the surface morphology deteriorated for a-miscut angles of 2° or greater. Similarly, Yamada et al. (J. Cryst. Growth, 310, 4968 (2008)) investigated InGaN/GaN epitaxial structures grown by MOCVD on m-plane substrates that were accurately on-axis or were miscut by 1°, 5°, or 10° toward the a-direction, by 1°, 2°, 3°, or 10° toward the +c-direction, or by 1°, 2°, 3°, 5°, or 10° toward the −c-direction. They reported that the surface roughness, the presence of hillocks, and the luminescence wavelength were sensitive to the miscut angle, with differences of 1° or 2° often having marked effects. Also, Lai et al. (J. Cryst. Growth 312, 902 (2010)) prepared m-plane substrates that were miscut by 0.1° or 0.7° toward the +c-direction or by 0.1° toward the a-direction and by 0.1° or 0.3° toward the +c-direction. These authors found that the surface roughness and the emission wavelength of InGaN/GaN epitaxial structures deposited on these substrates were sensitive to the miscut angle, with a difference as small as 0.2° having a large effect. When a miscut of only 0.1° in the a-direction was present, the surface roughness in pure n-type GaN layers was more than 25-times higher if the miscut angle in the +c-direction was 0.3° rather than 0.1°. As an additional example, Isobe et al. (Phys. Stat. Solidi (a) 208, 1191 (2011)) grew AlGaN/GaN heterostructures on m-plane bulk GaN substrates that were miscut by 0.3°, 1.2°, 3°, or 4° in the c-direction. Pure GaN constituted 99% of the layer thickness and therefore most of the observed effects were a consequence of simple GaN-on-GaN epitaxy. They found that the surface roughness and crystalline quality worsened significantly with increasing miscut angle, with a large drop-off as the miscut angle was increased from 0.3° to 1.2°. Confirming the sensitivity to substrate misorientation angle, Lin et al. (Appl. Phys. Express 2, 082102 (2009)) disclose that the surface morphology and laser diode device performance was markedly better when epitaxy was performed on m-plane substrates that were miscut by 1° toward the −c-direction than was the case with on-axis substrates.

These effects of surface orientation on epitaxy are not limited to MOCVD growth. For example, Sawicka et al. (J. Vac. Sci. Technology B 29, 03C135 (2011)) disclose that molecular beam epitaxy (MBE) on substrates vicinal to m-plane were strongly anisotropic and the morphology depended on both the miscut angle and miscut direction.

While the preceding discussion has focused on GaN epitaxy on vicinal m-plane substrates, the sensitivity of epitaxy to substrate misorientation is not unique to m-plane or even to GaN. For example, Xu et al. (Phys. Stat. Solidi (a) 202, 727 (2005)) reported the formation of hillocks upon MOCVD epitaxy on on-axis c-plane GaN substrates, but a miscut of 1, 2, 4, or 8 degrees in the m-direction or a-direction enabled growth of smooth layers. It is well known that surface morphology during crystal growth is determined by a competition between the rates of overall deposition, surface migration, nucleation of new layers, and "sticking" of growth species to step and to kink sites, the latter being very sensitive to miscut angle.

The optimum crystal growth process by a given method, for example ammonothermal growth, will in general differ for different crystallographic orientations of the seed crystals. An efficient manufacturing process may therefore involve growth on a large number of seed crystals, for example, at least three, at least 10, at least 25, at least 50, at least 100, at least 250, at least 500, or at least 1000, each of which perform similarly during the growth process. One might well conclude from the preceding discussion that to achieve an efficient manufacturing process for ammonothermal GaN crystals the surface orientation of each seed crystal must be controlled to a very high precision, for example, less than 0.05°. Surprisingly, however, we find that high fidelity ammonothermal crystal growth can be achieved when the misorientation angle from one seed crystal to another is greater than about 0.05 degree, greater than about 0.1 degree, greater than about 0.2 degree, greater than about 0.3 degree, greater than about 0.4 degree, greater than about 0.5 degree, greater than about 0.7 degree, or greater than about 1 degree, as long as the orientations are equivalent to within about 1 to about 5 degrees in specific crystallographic directions. This prescription enables a considerable reduction in the cost of preparing seed crystals, relative to the cost of maintaining extremely tight tolerances on the crystallographic orientation of each large-area face. In the case of growth on nominally m-plane seed crystals, as described in the examples, we find that high quality growth can be achieved when the miscut angle in the c-direction lies between about 5 degrees toward [000-1] and about 1 degree toward [000+1] and the miscut angle in the a-direction is less than or equal to about 1 degree for each large-area surface of each of a plurality of seeds. In the case of bi-faceted growth of semipolar orientations intermediate between m-plane and (1 0 −1 −1), we find that high quality growth can be achieved when the miscut angle in the c-direction lies between about 5 degrees toward [000-1] and about 1 degree toward [000+1] and the miscut angle in the a-direction is less than or equal to about 1 degree for each large-area surface of each of a plurality of seeds. In the case of growth on nominally c-plane seed crystals, we find that high quality growth can be achieved when the miscut angle in the m-direction is less than about 5 degrees and the miscut angle in the a-direction is less than or equal to about 5 degrees for each large-area surface of each of a plurality of seeds. This specification for crystallographic orientation is illustrated schematically in FIG. 12A, FIG. 12B, and FIG. 12C.

In certain embodiments, the seed crystals or plates have a rectangular or approximately rectangular shape. An approximately rectangular shape may be particularly appropriate for m-plane or a-plane seed plates. In certain embodiments, the corners of the seed crystals or plates are rounded or chamfered so as to minimize the likelihood of breakage. Rectangular shapes are convenient for mounting and for efficiently utilizing space within a high pressure crystal growth reactor.

In certain embodiments, the seed crystals or plates have a hexagonal or approximately hexagonal shape. A hexagonal shape may be particularly convenient when working with c-plane-oriented seed crystals or plates. In certain embodiments, the seed crystals or plates have a circular, oval, or approximately circular or oval shape.

In certain embodiments, particularly those with non-rectangular seed crystals or plates, the seed crystals may be arranged in a non-rectangular, close-packed way, as shown in FIG. 2C. Rather than comprising linear arrays of bars arranged into multiple tiers stacked vertically, the seed rack may comprise a honeycomb-type arrangement, with hexagonal, circular, rectangular or other shape cutouts arranged in a regular pattern. The honeycomb structure may be formed from a sheet by wire electric discharge machining, water-jet cutting, sawing, milling, drilling, or the like. Alternatively, the honeycomb structure may be fabricated from bent quasi-horizontal bars attached with vertical reinforcement structures.

The seed crystals may be positioned substantially vertically, in one or more axially-arranged tiers. More than three, more than ten, more than about 20, more than about 35, more than about 50, more than about 75, more than about 100, more than about 200, more than about 500, or more than about 1,000 seed crystals may be positioned within the seed rack. The spacing between adjacent rows, the spacing between adjacent seeds in a given row, and the spacing from the inner diameter of the sealable container (autoclave, liner, or capsule) may be chosen to be large enough so that, after growth of the seed crystals into boules, the crystals do not grow into one another and sufficient gaps remain so as to allow unimpeded fluid flow. Alternatively, the seed crystals may be positioned horizontally or at an angle between horizontal and vertical.

After loading the frame with seed crystals and raw material, the frame is placed inside a sealable container. The sealable container may constitute an autoclave or a capsule designed for use with an internally-heated high pressure apparatus. At least one mineralizer may be added. The mineralizer may comprise an alkali metal such as Li, Na, K, Rb, or Cs, an alkaline earth metal, such as Mg, Ca, Sr, or Ba, or an alkali or alkaline earth hydride, amide, imide, amidoimide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The mineralizer may be provided as a metal, a loose powder, as granules, or as at least one densified compact or pill. The mineralizer may be added to the raw material basket, may be placed in a crucible, or may be placed directly in the high pressure apparatus or capsule. In a certain embodiment, the mineralizer is added to the high pressure apparatus or capsule in the absence of exposure to air, such as inside a glove box.

The sealable container may then be closed and sealed except for a connection to a gas, liquid, or vacuum manifold. In one embodiment, the sealable container comprises an autoclave, as disclosed in U.S. Pat. No. 7,335,262. In certain embodiments, a sealable container comprises a metal can, as disclosed, for example, in U.S. Pat. No. 7,125,453, a container, as disclosed, for example, in U.S. Publication No. 2007/0234946, or a capsule, as disclosed, for example, in U.S. application Ser. No. 12/133,365. The inner diameter of the sealable container may be between about 1 inch and about 2 inches, between about 2 inches and about 3 inches, between about 3 inches and about 4 inches, between about 4 inches and about 6 inches, between about 6 inches and about 8 inches, between about 8 inches and about 10 inches, between about 10 inches and about 12 inches, between about 12 inches and about 16 inches, between about 16 inches and about 24 inches, or greater than about 24 inches. The clearance between the inner diameter of sealable container and the outer diameter of the frame may be between about 0.005 inch and about 1 inch, or between about 0.010 inch and about 0.25 inch. The ratio of the inner height of the sealable container to its inner diameter may be between about 1 and about 2, between about 2 and about 4, between about 4 and about 6, between about 6 and about 8, between about 8 and about 10, between 10 and about 12, between about 12 and about 15, between 15 and about 20, or greater than about 20.

In certain embodiments, the sealable container is evacuated, so as to remove air, moisture, and other volatile contaminants. In certain embodiments, the high pressure apparatus or capsule is heated during evacuation, to a temperature between about 25 degrees Celsius and about 500 degrees Celsius. In certain embodiments, the sealable container is heated using the same heating elements that are used during high pressure processing. In one specific embodiment, the capsule is heated by placing it inside an internally-heated pressure apparatus and heated using the heater for the latter.

Figure 3A:
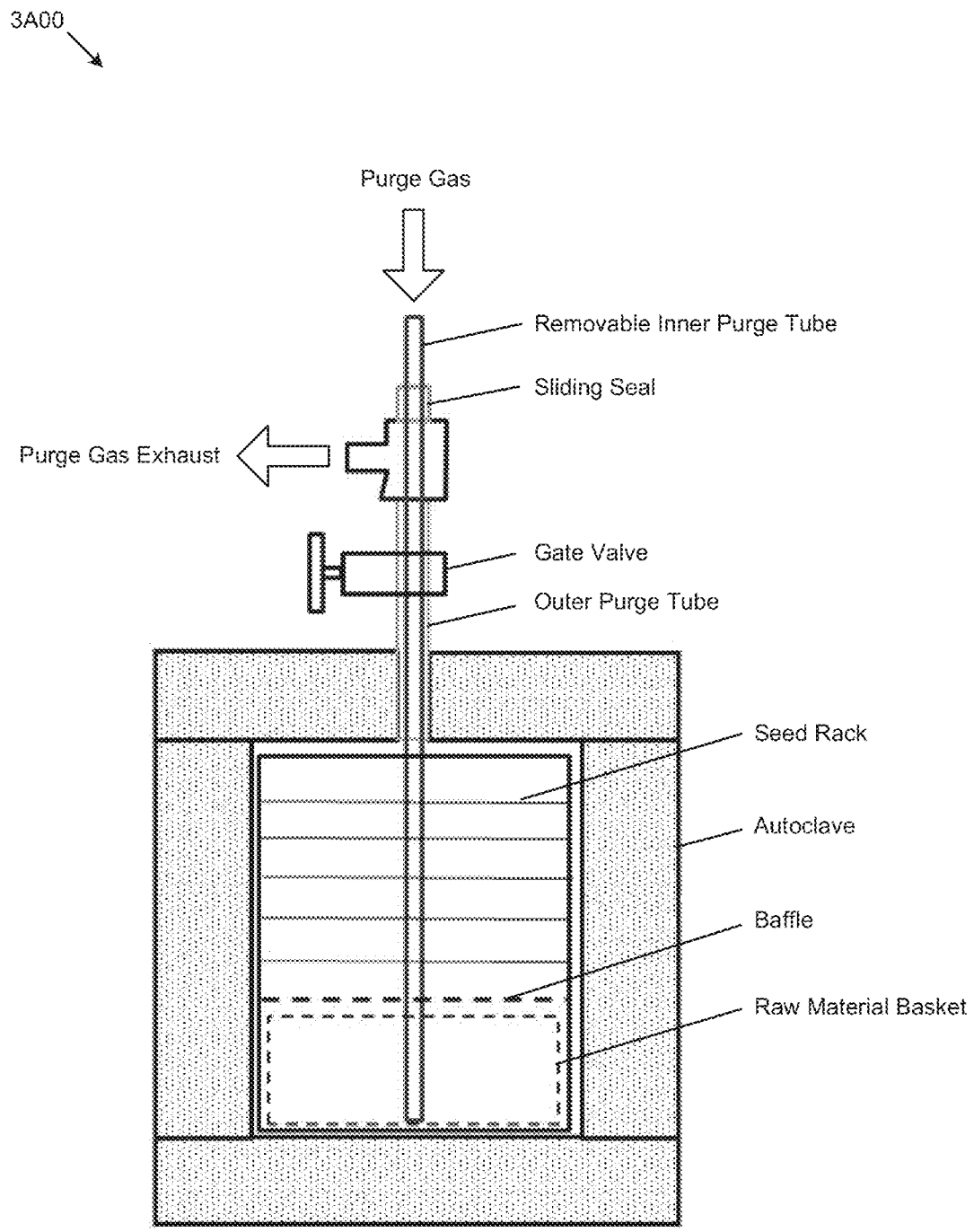
FIG. 3A and FIG. 3B are simplified diagrams illustrating processing methods for crystal growth apparatus according to embodiments of the present disclosure.
Figure 3B:
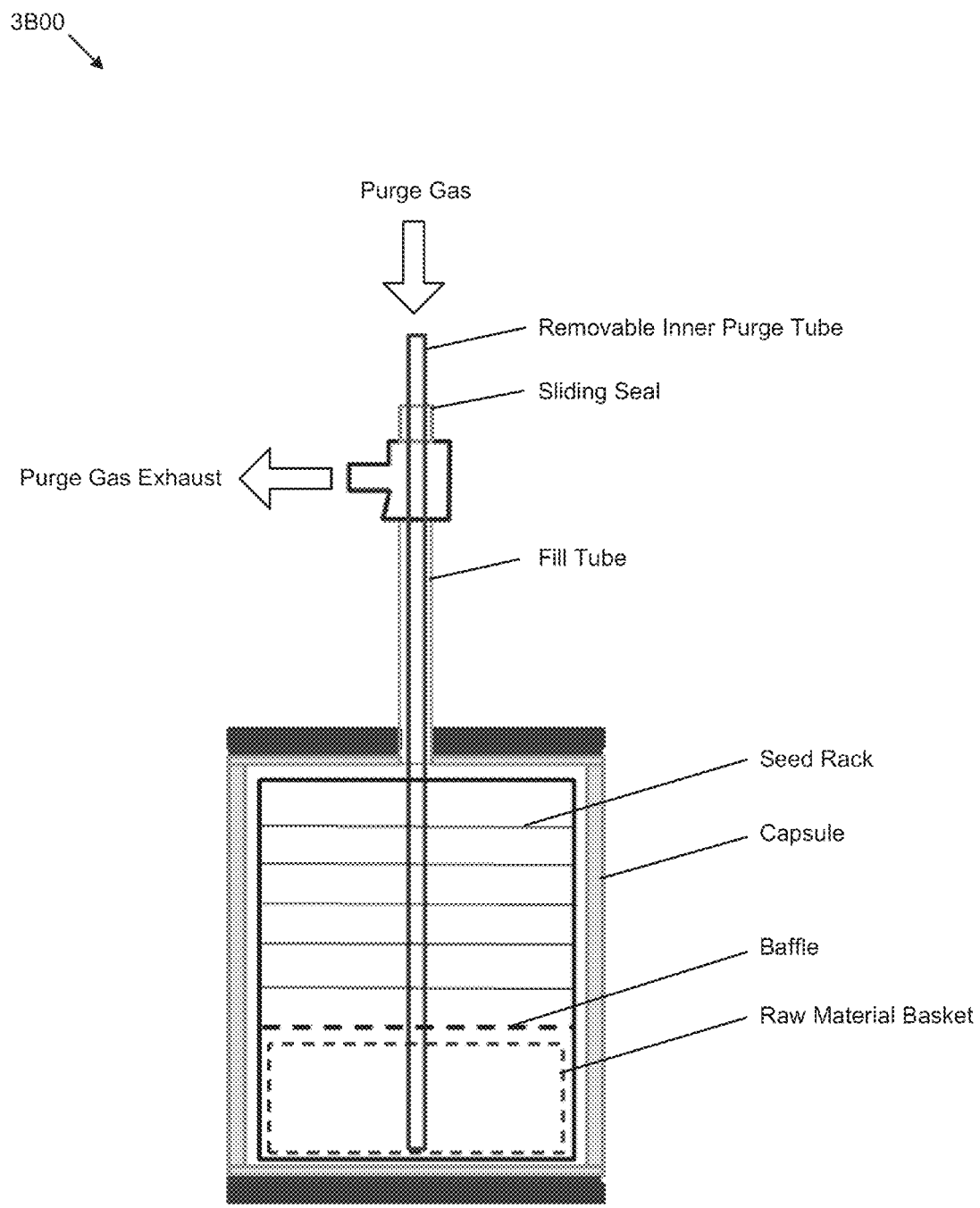

In certain embodiments, the autoclave or capsule containing the filled frame is purged to remove air, moisture, and other volatile contaminants, as shown in FIG. 3A and in FIG. 3B, diagrams 3A00 and 3B00, respectively. Purging may provide for superior removal of air, moisture, and other volatile contaminants, relative to evacuation, because of the limited conductance through a tube or long hole to the interior of the autoclave or capsule. The autoclave or capsule is then coupled to a gas source by means of at least one fill tube or purge tube, and without exposing the contents of the capsule to air, according to a specific embodiment. The gas source may comprise at least one of nitrogen, argon, hydrogen, helium, Freon, fluorine-containing gas, and solvent vapor, or a combination of any of the foregoing, among others. In certain embodiments, both a first fill or purge tube and a second fill or purge tube are coupled to a gas source and/or exhaust. In certain embodiments, an inner purge tube is placed inside the fill or outer purge tube and positioned so that one end is proximate to the bottom end of the autoclave or capsule. The inner purge tube and outer purge tube may be fabricated from at least one of copper, copper-based alloy, gold, gold-based alloy, silver, silver-based alloy, palladium, platinum, iridium, ruthenium, rhodium, osmium, iron, iron-based alloy, nickel, nickel-based alloy, chromium, chromium-based alloy, molybdenum, and combinations thereof. Iron-base alloys that may be used to form the inner purge tube or outer purge tube include, but are not limited to, stainless steels. Nickel-base alloys that may be used to form the inner purge tube or outer purge tube include, but are not limited to, Inconel®, Hastelloy®, and the like. The outer diameter of the inner purge tube may be less than the inner diameter of the fill or outer purge tube by at least 0.010 inch, as shown. The inner purge tube may be coupled to the fill or outer purge tube by means of a tee fitting or other suitable technique, so that purge gas introduced through the inner purge tube will exit near the bottom end of the autoclave or capsule, pass through the length of the autoclave or capsule before exhausting though the annular space in the fill or outer purge tube outside the inner purge tube and the tee fitting, providing for efficient removal of gas phase contaminants according to a specific embodiment. The interface between the tee fitting and the inner purge tube may be a sliding seal, for example, an O-ring or a differentially-pumped set of Teflon® seals or O-rings. The rate of flow of the purge gas may be in the range between about 0.05 and about 50 standard liters per minute. The autoclave or capsule may be heated, for example, to a temperature between about 25 degrees Celsius and about 500 degrees Celsius during the purge operation, in order to more efficiently remove water and other adsorbed contaminants. After shutting off flow of the purge gas, nitrogen-containing solvent vapor, for example, gas phase ammonia, may be flowed through the autoclave or capsule in order to remove most or all of the purge gas.

In certain embodiments, the inlet of the gas flow, for example, the second fill tube or the purge tube may then be coupled to a source of liquid nitrogen-containing solvent, such as ammonia. The sealable container and fill tube(s) may be cooled, or the liquid solvent delivery system and transfer lines heated, so that the former are cooler by between about one and 50 degrees Celsius than the latter. Liquid solvent may then be introduced into the sealable container at a rate between about 0.1 and about 1,000 grams per minute. At room temperature, the vapor pressure of ammonia is approximately 10 atmospheres. Depending on the temperature of the solvent source, therefore, the system pressure during solvent delivery may be above about 7 atmospheres, above about 8 atmospheres, above about 9 atmospheres, or above about 10 atmospheres. In one embodiment, the purge exhaust is closed and the nitrogen-containing solvent vapor above the liquid is forced to condense into liquid during the filling operation. In these embodiments, the autoclave or capsule may be actively cooled in order to dissipate the heat released by condensation of the solvent vapor. In certain embodiments, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the sealable container may be determined by using a liquid delivery system with the capability for accurately monitoring and controlling the mass of liquid delivered. An example of suitable equipment for delivery of precision-metered, high-purity liquid ammonia is the InScale™ system manufactured by iCon Dynamics, LLC. In certain embodiments, the amount of ammonia delivered to the sealable container is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the sealable container. An analogous method for determining the quantity of vented solvent may be performed in cases where the solvent is different from ammonia.

In certain embodiments, a solvent is delivered to a sealable container as a vapor at elevated pressure. The inlet of the gas flow, for example, the second fill tube or the purge tube is then coupled to a source of vapor-phase solvent. The sealable container and fill tube(s) may be cooled, or the solvent delivery system and transfer lines heated, so that the former are cooler by between about one and about 50 degrees Celsius than the latter. Vapor-phase solvent is then introduced into the sealable container at a rate between about 0.1 and about 1,000 grams per minute and allowed to condense in the sealable container. The pressure of the solvent vapor should be higher than the equilibrium vapor pressure at the temperature of the sealable container. Depending on the temperature of the sealable container and of the solvent delivery system, the pressure during solvent delivery may be above about 7 atmospheres, above about 8 atmospheres, above about 9 atmospheres, or above about 10 atmospheres. In certain embodiments, the purge exhaust is closed and the solvent vapor above the liquid is forced to condense into liquid during the filling operation. In this embodiment, the sealable container may be actively cooled in order to dissipate the heat released by condensation of the solvent vapor. In certain embodiments, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the sealable container may be determined by using a vapor delivery system equipped with a mass flow meter. In certain embodiments, the amount of ammonia delivered to the sealable container is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the capsule. An analogous method for determining the quantity of vented solvent may be performed in cases where the solvent is different from ammonia.

The inner purge tube, if present, may be removed after the sealable container (e.g., autoclave or capsule) is filled. In certain embodiments, the inner purge tube may be removed after the purging step but before the filling step. A gate valve to the autoclave, or the fill tube(s) to the capsule, are then sealed. Once sealed, the interior of the autoclave or of the capsule is substantially air-free, and the at least one material contained therein can be processed with reduced risk of contamination. Of course, there can be other variations, modifications, and alternatives.

In certain embodiments, an autoclave may then be heated to crystal growth conditions. In certain embodiments, the capsule is placed inside an autoclave, an internally-heated pressure apparatus, or other high pressure apparatus, and heated to crystal growth conditions. In certain embodiments, the thermal cycle includes a pre-reaction segment to form mineralizer, polycrystalline gallium nitride, dissolved gallium containing complexes, or the like. In certain embodiments, the atmosphere in the autoclave may be modified during the run. For example, excess $H_2$ formed by reaction of gallium metal with ammonia may be bled off through the gate valve or allowed to diffuse through a heated palladium membrane. Excess nitrogen formed by decomposition of an azide mineralizer may be bled off through the gate valve. Additional ammonia may be added to replenish the solvent in the high pressure apparatus.

Suitable thermal cycles for crystal growth are disclosed, for example, in U.S. Pat. Nos. 6,656,615 and 7,078,731. The crystals grow predominantly perpendicular to the large-diameter faces, but may also grow in lateral directions as well. The crystals may be prevented from growing into one another by crystal separator plates.

After performing crystal growth for a predetermined period of time, the autoclave or high pressure apparatus is cooled. When the autoclave or capsule has cooled to below about 100 degrees Celsius, below about 75 degrees Celsius, below about 50 degrees Celsius, or below about 35 degrees Celsius, a valve to the autoclave is opened, or the capsule is vented, and the ammonia is removed. In certain embodiments, the sealable container is vented at high temperature. In certain embodiments, this venting is accomplished by opening of a valve attached to the sealable container. In certain embodiments, gas-phase ammonia is allowed to exit the autoclave or capsule and is bubbled through an acidic aqueous solution in order to be chemically trapped. In certain embodiments, gas phase ammonia is passed through a flame so as to burn the ammonia, forming $H_2O$ and $N_2$.

After cooling, removal of the ammonia, and opening of the autoclave or internally-heated high pressure apparatus and capsule, the frame can be removed from the autoclave or capsule, and the grown crystals are removed from the seed rack. If necessary, portions of the clips that have been overgrown by crystalline material may be removed by etching in an appropriate acid, such as at least one of hydrochloric acid, sulfuric acid, nitric acid, and hydrofluoric acid.

The foregoing describes ammonothermal growth of semipolar bulk GaN boules. In certain embodiments one or more semipolar bulk GaN boules is grown by other methods that are known in the art, such as hydride vapor phase epitaxy (HVPE) or a flux method. Conditions may be chosen so that high-index faces grow out to form stable facets such as m-plane and $\{1\ 0\ -1\ \pm 1\}$ and continued bi-faceted growth performed. For example, in a specific embodiment, two or more semipolar GaN wafers are precisely tiled on a substrate or seed holder using any known methods. For example, in U.S. Patent Application 2012/0112320, Kubo et al. teach a method for aligning two or more GaN wafers on a substrate and coalescing by HVPE. The tiled wafers are then placed in a HVPE crystal growth reactor and grown by HVPE at a temperature above about 900 degrees Celsius, causing coalescence of the tiled crystals and forming a bi-faceted growth front. In another specific embodiment, a pattern of parallel grooves is formed on the surface of a seed crystal in order to initiate bi-faceted HVPE growth. The grooves may be oriented to be substantially parallel to the $[000\pm 1]\pm c$-direction. In another specific embodiment, a pattern of parallel mask lines are formed on the surface of a seed crystal in order to initiate bi-faceted HVPE growth. The mask lines may comprise at least one of $SiO_2$ and $SiN_x$ and may be deposited, for example, by thermal evaporation, electron-beam evaporation, sputtering, chemical vapor deposition, plasma-enhanced chemical vapor deposition, or the like. The mask lines may be oriented to be substantially parallel to the $[000\pm 1]\pm c$-direction. The grooved or masked seed crystal is then placed in a HVPE crystal growth reactor and grown by HVPE at a temperature above about 900 degrees Celsius, forming a bi-faceted growth front.

One or more wafers may be prepared from the as-grown boule using a single- or multiwire saw, an inner-diameter saw, an outer-diameter saw, or the like. Prior to sawing, the boule may be precisely oriented using an x-ray goniometer, so as to prepare wafers with a pre-determined miscut angle. After slicing, the crystal wafers may be lapped, polished, and chemical-mechanically polished by methods that are known in the art. In some embodiments, the average dislocation density at the large-area surfaces of the wafers is less than about $10^7$ cm$^{-2}$. In some embodiments, the average dislocation density at the large-area surfaces of the wafers is less than about $10^6$ cm$^2$, less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the symmetric x-ray diffraction rocking curve corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds. In some embodiments, the full width at half maximum of the lowest-order asymmetric x-ray diffraction rocking curve associated with the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds. In certain embodiments, the wafers have a semipolar orientation within about 3 degrees of one of $\{6\ 0\ -6\ \pm 1\}$, $\{5\ 0\ -5\ \pm 1\}$, $\{4\ 0\ -4\ \pm 1\}$, $\{3\ 0\ -3\ \pm 1\}$, $\{5\ 0\ -5\ \pm 2\}$, $\{2\ 0\ -2\ \pm 1\}$, $\{3\ 0\ -3\ \pm 2\}$, $\{4\ 0\ -4\ \pm 3\}$, and $\{5\ 0\ -5\ \pm 4\}$.

FIG. 5 depicts a block diagram of a system for growth of a gallium-containing nitride crystal. As shown in FIG. 5, the method of system 500 commences at a step to load raw material into raw material basket (see step 505) and proceeds with steps to: suspend seed crystals or plates on seed rack (see step 510); place frame into autoclave or capsule (see step 515); add mineralizer to autoclave or capsule (see step 520); and evacuate or purge autoclave or capsule (see step 525). In certain embodiments, steps include operations to bake the autoclave or capsule during an evacuation or purge (see step 530). Then, next steps are operable to fill autoclave or capsule with liquid ammonia (see step 535); to provide electrical energy to heating member to heat autoclave capsule to predetermined process temperature and process pressure, so as to cause the solvent to become supercritical (see step 540). Finishing steps include operations to cool the autoclave or capsule and remove crystals (see step 545). Further finishing can include operations to slice and polish crystals to form a wafer (see step 550).

The crystal wafers are useful as substrates for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for a photoelectrochemical water splitting and hydrogen generation device.

In certain embodiments, any of the above sequence of steps provides a method according to embodiments of the present disclosure. In certain embodiments, the present disclosure provides a method and resulting crystalline material provided by a pressure apparatus having a basket structure. Other alternatives can also be provided where steps are added, one or more steps are removed, or one or more steps are provided in a different sequence without departing from the scope of the claims herein.

Figure 10:
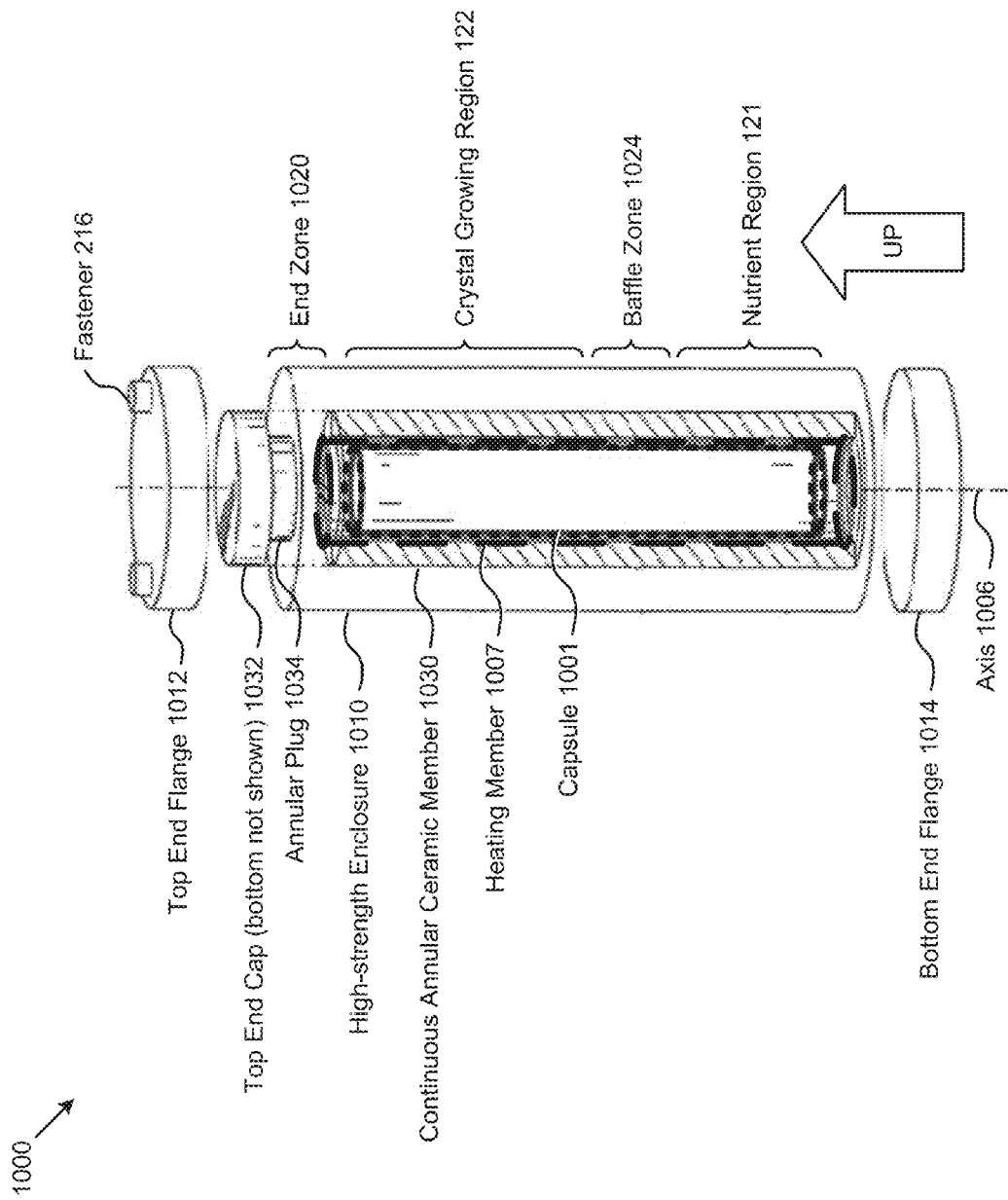
FIG. 10 is a simplified diagram of an apparatus for a crystal growth process according to embodiments of the present disclosure.

FIG. 10 is a simplified diagram 1000 of a high pressure apparatus 1000 for crystal growth (a type of crystal growth reactor). Shown is a capsule 1001 and three, four, 10, 20, 50, 100, or more seed crystals placed within the capsule, which in turn is placed within a heating member 1007. The heating member defines a plurality of at least two independently-controllable zones. The zones may include an end zone 1020, a crystal growing region 122, a baffle zone 1024, and a nutrient region 121. At least the crystal growing region or zone 122 and the nutrient region or zone 124 are necessary for ammonothermal crystal growth. An independently-controllable baffle zone 1024 may be useful for process optimization. Due to axial end losses, in the absence of additional hot zones the top of the top zone and the bottom of the bottom zone will each be cooler than the crystal growing region and the nutrient regions, respectively. One or more end zones may be incorporated to provide additional heating to the ends to compensate for the axial heat losses and reduce or eliminate the temperature dip at one or more ends. This particular arrangement is suitable for a system with normal solubility, for example, when $NH_4Cl$ is used as the mineralizer. In other cases, for example, for ammonobasic growth or when $NH_4F$ is used as the mineralizer, the positions of the growth zone and nutrient zone are reversed, so that the nutrient zone lies above the growth zone. In general, during growth, the upper zone(s) are maintained at a lower temperature than the lower zone(s). The heating member is positioned within a continuous annular ceramic member 1030, which in turn is positioned within a high strength enclosure 1010. One or more annular plugs 1034 and end caps 1032 may be provided (e.g., for axial thermal insulation). The ends of the apparatus may be closed by top end flange 1012 and bottom end flange 1014. Axis 1006 is common to the capsule, the heating member, the continuous annular ceramic member, and the high strength enclosure.

Figure 11:
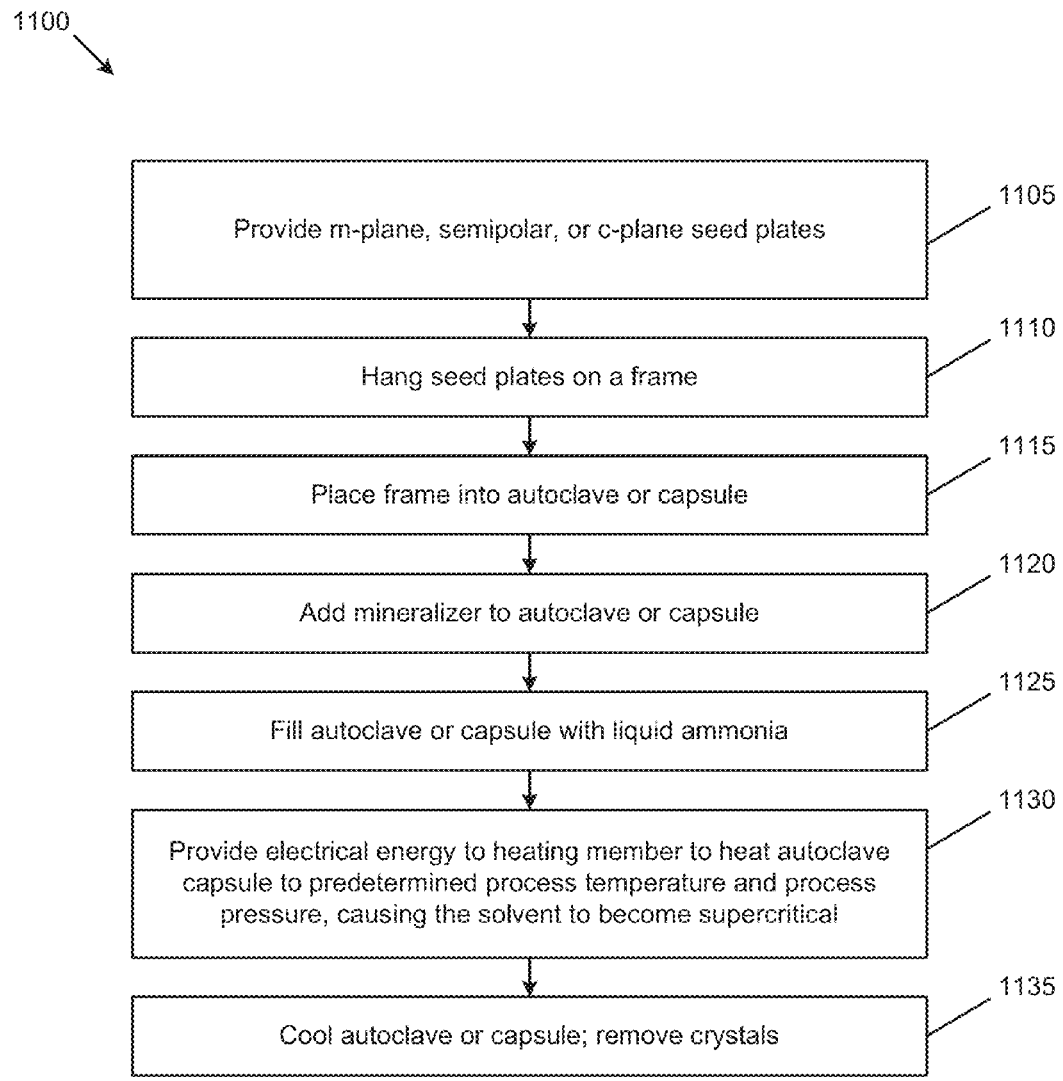
FIG. 11 is a flow chart illustrating a crystal growth process according to embodiments of the present disclosure.

FIG. 11 is a simplified diagram of flow chart illustrating a crystal growth process. As shown the method 1100 results in crystalline material being produced in a pressure apparatus (e.g., an autoclave or a capsule within an autoclave or an internally-heated high pressure apparatus) having a basket structure and a seed frame. As shown, the method commences upon starting with at least 3 m-plane, semipolar, or c-plane seed crystals, each side of which has a miscut as described above (see operation 1105). Next the method provides the means to hang seed crystals on a frame (see operation 1110), the frame suited to be placed within an autoclave or capsule (see operation 1115). Then, mineralizer is added to the autoclave or capsule (see operation 1120) and fills the autoclave or capsule with liquid ammonia (see operation 1125). For forming the crystalline material, the method provides electrical energy to heating member in order to heat the autoclave or capsule to a predetermined process temperature and predetermined process pressure, causing the solvent to become supercritical (see operation 1130). Method 1100 concludes by cooling the autoclave or capsule and removing the crystals (see operation 1135).

Figure 12A:
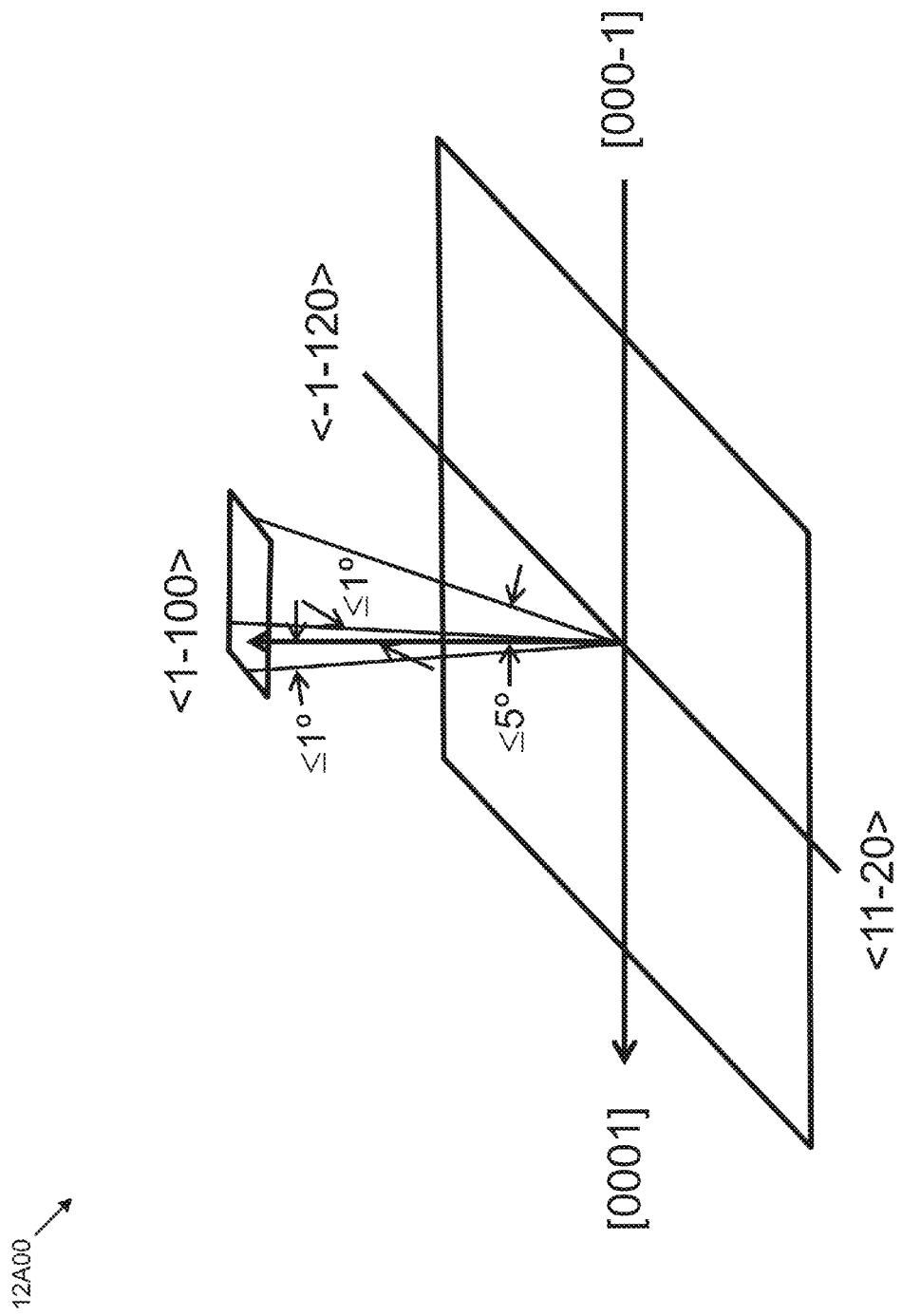

FIG. 12A is a simplified diagram 12A00 showing a range of crystallographic orientations suitable for seed crystals for m-plane crystal growth as used in certain embodiments of the present disclosure. One might have expected that to achieve an efficient manufacturing process for ammonothermal GaN crystals the surface orientation of each seed crystal must be controlled to a very high precision, for example, less than about 0.05°. Surprisingly, however, as illustrated in the examples, we find that high fidelity ammonothermal crystal growth can be achieved on near-m-plane seed crystals or seed plates when the miscut angle in the c-direction for each of the seeds lies between about 5 degrees toward [000-1] and about 1 degree toward [000+1] and the miscut angle in the a-direction is less than or equal to about 1 degree for each large-area surface of each of a plurality of seed plates. This prescription enables a considerable reduction in the cost of preparing seeds, relative to the cost of maintaining extremely tight tolerances on the crystallographic orientation of each large-area face coupled with efficient manufacturing. In certain embodiments, semipolar wafers are prepared by growing boules perpendicular to the m-plane and then slicing at an oblique angle, as shown in FIG. 6C and in FIG. 9.

FIG. 12B is a simplified diagram 12B00 showing a range of crystallographic orientations suitable for seed crystals for growth of bi-faceted crystals with semipolar orientations 1280 intermediate between m-plane and {1 0 -1 -1} as used in certain embodiments of the present disclosure. We find that high fidelity ammonothermal crystal growth can be achieved when the miscut angle in the c-direction for each of the seeds lies between about 5 degrees toward [000-1] and about 5 degrees toward [000+1] with respect to the nominal semipolar orientation and the miscut angle in the a-direction is less than or equal to about 1 degree for each large-area surface of each of a plurality of seed plates. This prescription enables a considerable reduction in the cost of preparing seeds, relative to the cost of maintaining extremely tight tolerances on the crystallographic orientation of each large-area face coupled with efficient manufacturing. In certain embodiments, semipolar wafers are prepared by growing boules perpendicular to the semipolar plane and then slicing at approximately parallel angles, as shown in FIG. 6B.

Figure 12C:
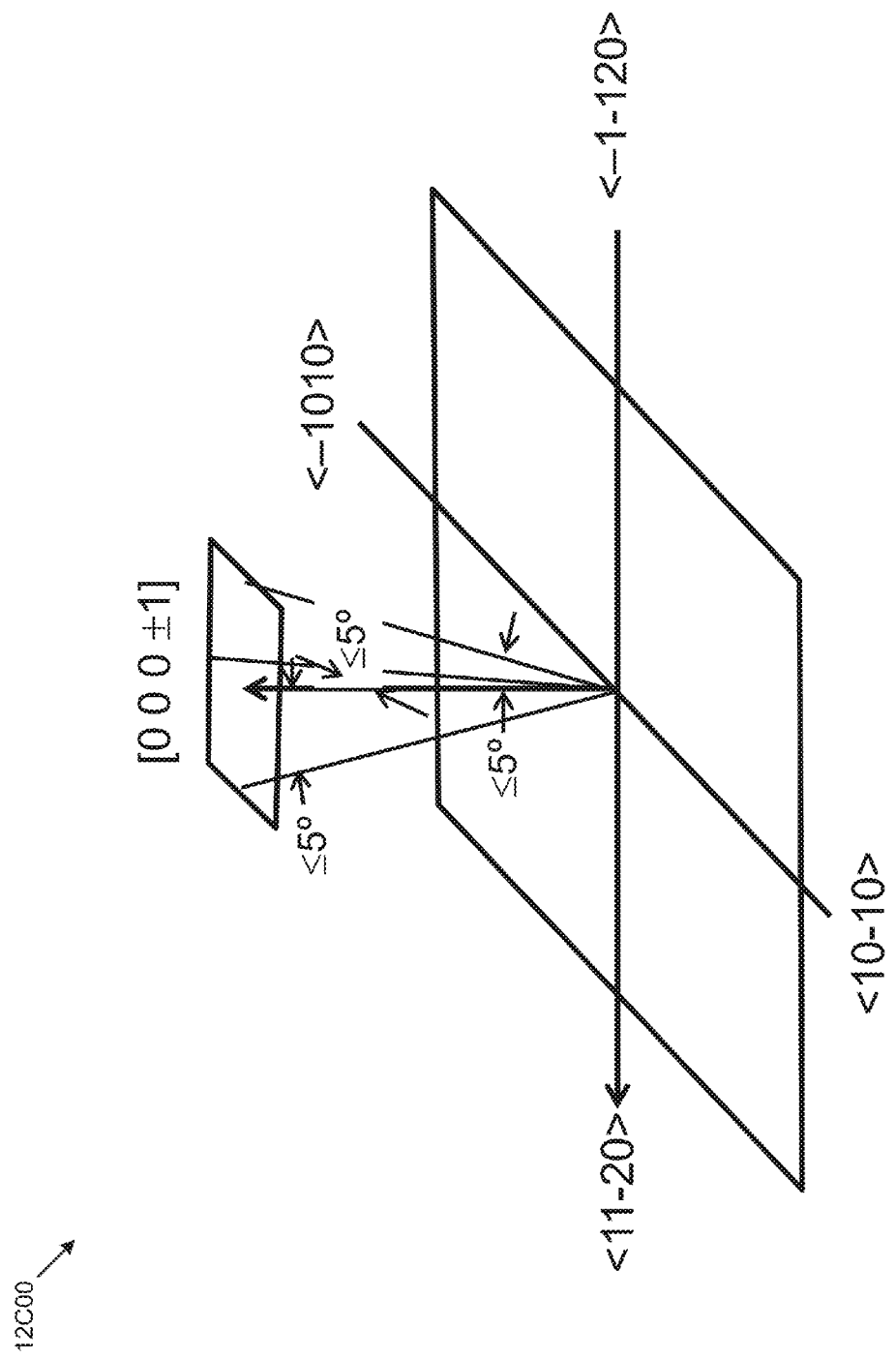

FIG. 12C is a simplified diagram showing a range of crystallographic orientations suitable for seed crystals for c-plane crystal growth as used in certain embodiments of the present disclosure. We find that high fidelity ammonothermal crystal growth can be achieved when the miscut angles in each of the m-direction and the a-direction are below about 5 degrees for each large-area surface of each of a plurality of seed plates. This prescription enables a considerable reduction in the cost of preparing seeds, relative to the cost of maintaining extremely tight tolerances on the crystallographic orientation of each large-area face coupled with efficient manufacturing. In certain embodiments, semipolar wafers are prepared by growing boules perpendicular to the c-plane and then slicing at an oblique angle, as shown in FIG. 6C and in FIG. 9.

Figure 13:
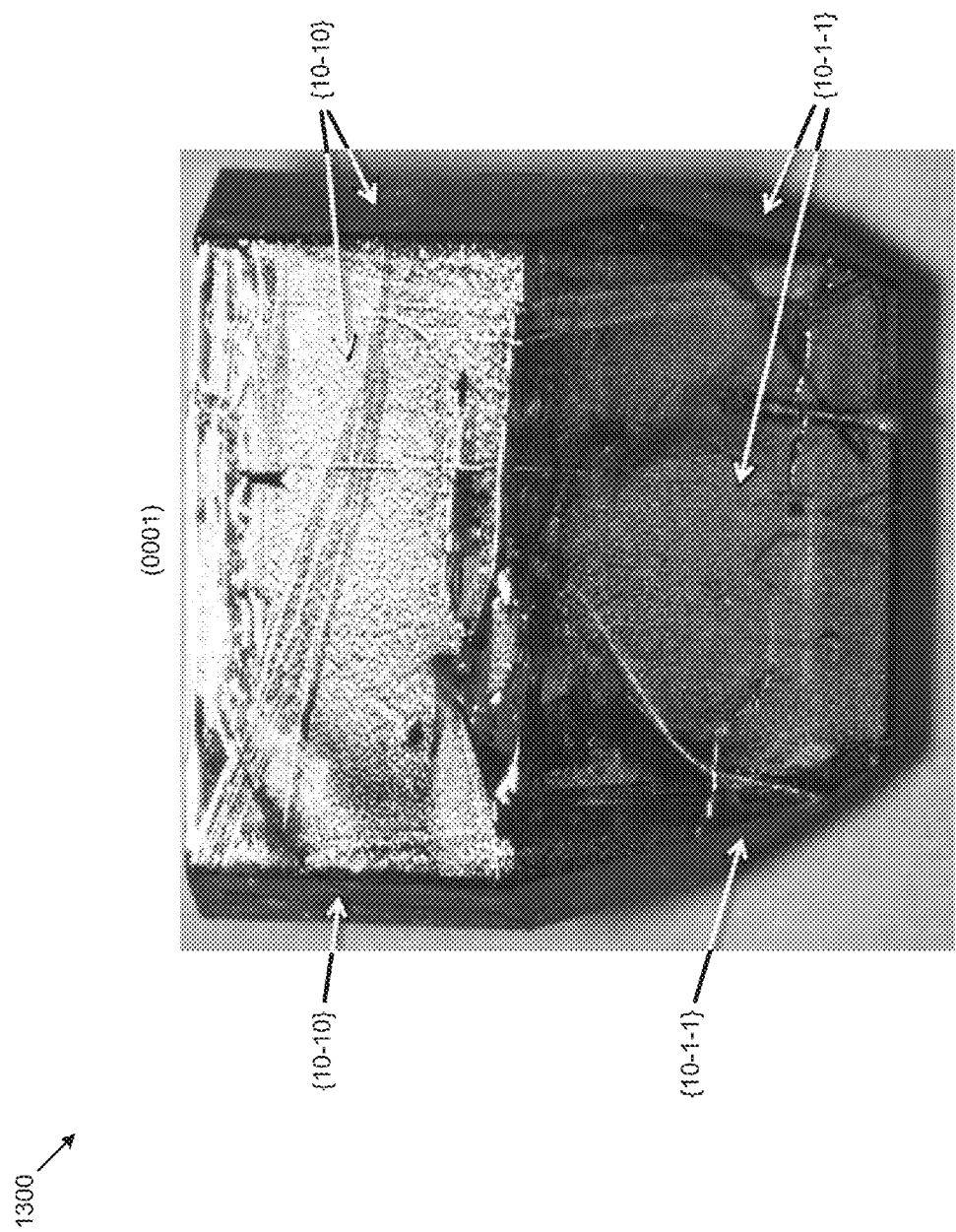
FIG. 13 is a photograph of a grown boule according to an embodiment of the present disclosure.

FIG. 13 is a photograph 1300 of a grown boule according to an embodiment of the present disclosure. The (2 0 -2 -1) face of a seed crystal grew out ammonothermally to form stable, large-area (1 0 -1 -1) and (1 0 -1 0) facets, plus additional m-plane and {1 0 -1 -1} side facets. The growth conditions for this crystal are described in Example 4.

Figure 14:
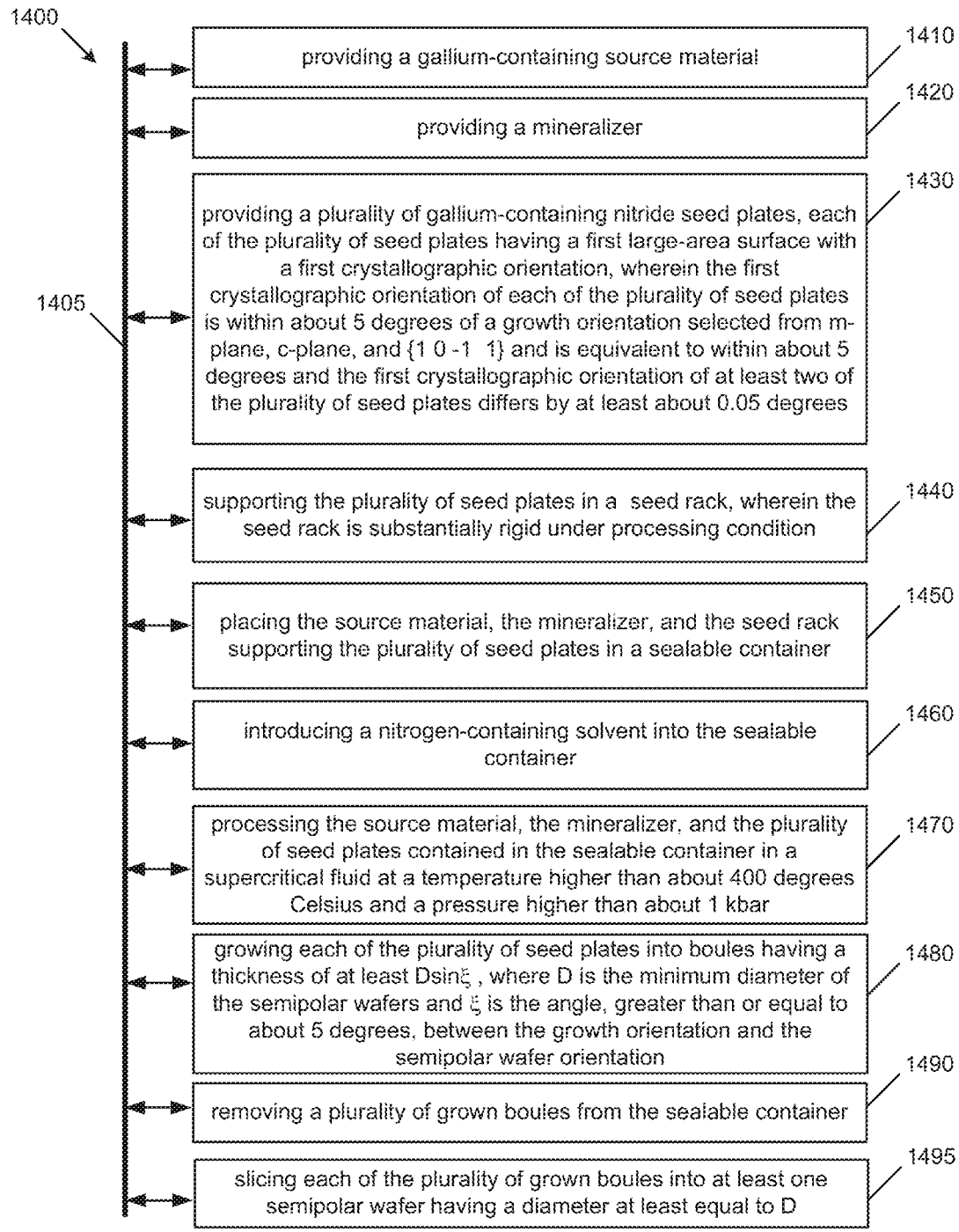
FIG. 14 is a chart depicting a process for large-scale ammonothermal manufacturing of semipolar gallium nitride boules, according to an embodiment of the present disclosure.

FIG. 14 is a chart 1400 depicting a process for large-scale ammonothermal manufacturing of semipolar gallium nitride boules. As shown, the process has a plurality of operations, any of which operations in any embodiment (e.g., a processor, a tool, a reactor, etc.) can communicate with any other operation over communication path 1405. More specifically, the process describes a method for fabrication of a gallium-containing nitride semipolar wafer, the method comprising: providing a gallium-containing source material (see operation 1410); providing a mineralizer (see operation 1420); providing a plurality of gallium-containing nitride seed plates, each of the plurality of seed plates having a first large-area surface with a first crystallographic orientation, wherein the first crystallographic orientation of each of the plurality of seed plates is within about 5 degrees of a growth orientation selected from m-plane, c-plane, and {1 0 -1 ±1} and is equivalent to within about 5 degrees and the first crystallographic orientation of at least two of the plurality of seed plates differs by at least about 0.05 degrees (see operation 1430); supporting the plurality of seed plates in a seed rack, wherein the seed rack is substantially rigid under processing conditions (see operation 1440); placing the source material, the mineralizer, and the seed rack supporting the plurality of seed plates in a sealable container (see operation 1450); introducing a nitrogen-containing solvent into the sealable container (see operation 1460); processing the source material, the mineralizer, and the plurality of seed plates contained in the sealable container in a supercritical fluid at a temperature higher than about 400 degrees Celsius and a pressure higher than about 1 kbar (see operation 1470); growing each of the plurality of seed plates into boules having a thickness of at least D sin ζ, where D is the minimum diameter of the semipolar wafers and ζ is the angle, greater than or equal to about 5 degrees, between the growth orientation and the semipolar wafer orientation (see operation 1480); removing a plurality of grown boules from the sealable container (see operation 1490); and slicing each of the plurality of grown boules into at least one semipolar wafer having a diameter at least equal to D (see operation 1495).

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

Several bulk GaN crystals grown by HVPE, approximately 0.3 millimeters thick, were provided for use as seed crystals for ammonothermal growth. A first seed crystal had a large-area surface that was miscut from the m-plane by approximately 0.03 degree toward [11-20] and by approximately 0.05 degrees toward [000-1]. A second seed crystal had a large-area surface that was miscut from the m-plane by less than 0.1 degree toward [11-20] and by approximately 1 degree toward [000-1]. A third seed crystal had a large-area surface that was miscut from m-plane by less than 0.1 degree toward [11-20] and by approximately 4 degrees toward [000-1]. A fourth seed crystal had a large-area surface that was miscut from the m-plane by less than 0.1 degree toward [11-20] and by approximately 7 degrees toward [000-1]. The seed crystals were placed inside a silver capsule along with a 15%-open-area baffle, approximately 30.6 grams of polycrystalline GaN nutrient, 5.5 grams of $NH_4F$ mineralizer, and 28.6 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The crystals, which grew to thicknesses between 0.9 and 2.2 millimeters, were then examined under a microscope and their crystallinity was quantified by x-ray diffraction rocking curve analysis.

The on-axis m-plane crystal had excellent surface morphology on both the front and back surfaces. The x-ray-diffraction rocking curve full-width-at-half-maximum values for the (100) reflection, rocking about [11-20], the (100) reflection, rocking about [0001], and the off-axis (102) reflection were approximately 28 arc-seconds, 32 arc-seconds, and 20 arc-seconds, respectively, on side 1. On side 2, the corresponding values were approximately 26 arc-seconds, 32 arc-seconds, and 26 arc-seconds, respectively. These values indicate excellent crystallinity.

The m-plane crystal that began with a 1-degree miscut toward [000-1] also had excellent surface morphology on both the front and back surfaces, both of which appeared to have grown out to approximately on-axis m-plane. The x-ray-diffraction rocking curve full-width-at-half-maximum values for the symmetric (100) reflection, rocking about [11-20], the symmetric (100) reflection, rocking about [0001], and the asymmetric, or off-axis (102) reflection were approximately 67 arc-seconds, 53 arc-seconds, and 43 arc-seconds, respectively, on side 1, which corresponds to the face that was originally miscut by 1 degree toward [0001]. On side 2, which corresponds to the face that was originally miscut by 1 degree toward [000-1], the corresponding values were approximately 86 arc-seconds, 85 arc-seconds, and 46 arc-seconds, respectively. These values indicate excellent crystallinity.

The m-plane crystal that began with a 4-degree miscut toward [000-1] had good surface morphology on both the front and back surfaces. The face that was originally miscut toward [000-1] appeared to have grown out to on-axis m-plane, with a pronounced {1 0 −1 −1} facet. The face that was originally miscut toward [0001] was somewhat rougher. The x-ray-diffraction rocking curve full-width-at-half-maximum values for the (100) reflection, rocking about [11-20], the (100) reflection, rocking about [0001], and the off-axis (102) reflection were approximately 75 arc-seconds, 221 arc-seconds, and 51 arc-seconds, respectively, on side 1, which corresponds to the face that was originally miscut by 4 degrees toward [0001]. On side 2, which corresponds to the face that was originally miscut by 4 degrees toward [000-1], the corresponding values were approximately 40 arc-seconds, 144 arc-seconds, and 134 arc-seconds, respectively. These values indicate that crystallinity has been degraded somewhat, particularly on the face that was miscut toward [0001].

The m-plane crystal that began with a 7-degree miscut toward [000-1] had good surface morphology on one face but the other exhibited considerable roughness. The face that was originally miscut toward [000-1] appeared to have grown out to on-axis m-plane, with a pronounced {1 0 −1 −1} facet. The face that was originally miscut toward [0001] was significantly rougher. The x-ray-diffraction rocking curve full-width-at-half-maximum values for the (100) reflection, rocking about [11-20], the (100) reflection, rocking about [0001], and the off-axis (102) reflection were approximately 102 arc-seconds, 292 arc-seconds, and 60 arc-seconds, respectively, on side 1, which corresponds to the face that was originally miscut by 7 degrees toward [0001]. On side 2, which corresponds to the face that was originally miscut by 7 degrees toward [000-1], the corresponding values were approximately 73 arc-seconds, 123 arc-seconds, and 55 arc-seconds, respectively. These values indicate that crystallinity has been degraded significantly, particularly on the face that was miscut toward [0001].

Example 2

Several bulk GaN crystals grown by HVPE, approximately 0.3 millimeters thick, were provided for use as seed crystals for ammonothermal growth. A first seed crystal had a large-area surface that was miscut from the m-plane by approximately 0.03 degree toward [11-20] and by approximately 0.05 degree toward [000-1]. A second seed crystal had a large-area surface that was miscut from m-plane by approximately 4.9 degrees toward [11-20] and by approximately 1.2 degrees toward [000-1]. A third seed crystal had a large-area surface that was miscut from m-plane by approximately 4.6 degrees toward [11-20] and by approximately 7.2 degrees toward [000-1]. The seed crystals were placed inside a silver capsule along with a 15%-open-area baffle, approximately 37.1 grams of polycrystalline GaN nutrient, 2.6 grams of NH$_4$F mineralizer, and 29.6 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The crystals, which grew to thicknesses between 0.8 and 1.5 millimeters, were then examined under a microscope.

The on-axis m-plane crystal had excellent surface morphology on both the front and back surfaces. However, the crystal that was grown on the seed that was miscut 1 degree toward [000-1] and 5 degrees toward [11-20] was rougher, and the crystal that was grown on the seed that was miscut 7.2 degrees toward [000-1] and 4.6 degrees toward [11-20] was quite rough and irregular on both faces. X-ray diffraction measurements were not performed due to the roughness of the surfaces.

Example 3

Several bulk GaN crystals grown by HVPE, approximately 0.3 millimeters thick, were provided for use as seed crystals for ammonothermal growth. A first seed crystal had a large-area surface that was miscut from the m-plane by approximately 0.03 degree toward [11-20] and by approximately 0.05 degrees toward [000-1]. A second seed crystal had a large-area surface that was miscut from (10-1-1) by approximately 0.01 degree toward [-12-10] and by approximately 0.39 degrees toward [0001]. The seed crystals were placed inside a silver capsule along with a 15%-open-area baffle, approximately 36.9 grams of polycrystalline GaN nutrient, 2.7 grams of NH$_4$F mineralizer, and 29.1 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The crystals, which grew to thicknesses between 0.6 and 2.2 millimeters, were then examined under a microscope.

The on-axis m-plane crystal had excellent surface morphology on both the front and back surfaces. The {10-1-1} surface of the semipolar crystal was flat and had a good surface morphology. However, the backside of the crystal, with a nominal orientation of {10-11}, had a surface morphology that was rough and irregular. The {10-1-1} surface of the crystal was characterized by x-ray diffraction. The x-ray-diffraction rocking curve full-width-at-half-maximum values for the (10-1) reflection, rocking parallel to [0001], the (10-1) reflection, rocking perpendicular to [0001], and the off-axis (002) reflection were approximately 52 arcseconds, 198 arc-seconds, and 125 arc-seconds, respectively, indicating good crystallinity.

Example 4

Several bulk GaN crystals grown by HVPE, approximately 0.3 millimeters thick, were provided for use as seed crystals for ammonothermal growth. A first seed crystal had a large-area surface that was miscut from the (2 0 -2 -1) plane by approximately 0.03 degree toward [-12 -10] and by approximately 0.15 degree toward [0001]. A second seed crystal had a large-area surface that was miscut from the (3 0 -3 -1) plane by approximately -0.01 degree toward [-12 -10] and by approximately 0.43 degree toward [0001]. The seed crystals were placed inside a silver capsule along with a 33%-open-area baffle, approximately 39.2 grams of polycrystalline GaN nutrient, 2.7 grams of NH$_4$F mineralizer, and 30.1 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The crystals, which grew to thicknesses between 1.4 and 2.6 millimeters, were then examined under a microscope.

The large area surface on the crystal that was originally (2 0 -2 -1)-oriented faceted to form two well-formed facets comprising m-plane and (1 0 -1 -1), as shown in FIG. 13. Both the m-plane and (1 0 -1 -1) facets had a good surface morphology. However, the backside of the crystal, with a nominal orientation of (2 0 -2 1), had a surface morphology that was rough and irregular.

The large area surface on the crystal that was originally (3 0 -3 -1)-oriented faceted to form two well-formed facets comprising m-plane and (1 0 -1 -1). Both the m-plane and (1 0 -1 -1) facets had a good surface morphology. However, the backside of the crystal, with a nominal orientation of (3 0 -3 1), had a surface morphology that was rough and irregular. The (3 0 -3 -1) side of the crystal was very similar in appearance to that of the (2 0 -2 -1) crystal except for different relative areas of the m-plane and (1 0 -1 -1) facets. This similarity is consistent with the almost -5-degree difference in tilt angle toward [0 0 0 1] between the two orientations and indicates that bi-faceted growth proceeds smoothly for a range of miscuts along [0 0 0 1] as long as the a-miscut angle is small, for example, less than about 1 degree.

Example 5

Several bulk GaN crystals grown by HVPE, approximately 0.3 millimeters thick, were provided for use as seed crystals for ammonothermal growth. A first seed crystal had a large-area surface that was miscut from the (2 0 -2 -1) plane by less than degree toward [11-20] and by between 1 and -1 degree toward [0001]. A second seed crystal had a large-area surface that was miscut from the (3 0 -3 -1) plane by less than degree toward [11-20] and by between 1 and -1 degree toward [0001]. The seed crystals were placed inside a silver capsule along with a 33%-open-area baffle, approximately 46.3 grams of polycrystalline GaN nutrient, 2.7 grams of NH$_4$F mineralizer, and 29.6 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The seed crystals, which grew to thicknesses between 1.1 millimeters and 2.4 millimeters, were then examined under a microscope.

The large area surface on the crystal that was originally (2 0 -2 -1)-oriented faceted to form two well-formed facets comprising m-plane and (1 0 -1 -1). Both the m-plane and (1 0 -1 -1) facets had a good surface morphology. However, the backside of the crystal, with a nominal orientation of (2 0 −2 1}, had a surface morphology that was rough and irregular. Both the m-plane and (1 0 −1 −1) facets on the (2 0 −2 −1} side of the crystal were characterized by secondary ion mass spectrometry (SIMS). The measured concentration of O impurity on the m-plane facet was $3.4 \times 10^{19}$ cm$^{-3}$, approximately 17% higher than the concentration on the (1 0 −1 −1) facet, $2.9 \times 10^{19}$ cm$^{-3}$. The measured concentration of H impurity on the m-plane facet was $6 \times 10^{19}$ cm$^{-3}$, approximately 1.8× higher than the concentration on the (1 0 −1 −1) facet, $3.3 \times 10^{19}$ cm$^{-3}$. The measured concentration of F impurity on the m-plane facet was $5.5 \times 10^{17}$ cm$^{-3}$, approximately 3.7× higher than the concentration on the (1 0 −1 −1) facet, $1.5 \times 10^{17}$ cm$^{-3}$.

The large area surface on the crystal that was originally (3 0 −3 −1)-oriented faceted to form two well-formed facets comprising m-plane and (1 0 −1 −1). Both the m-plane and (1 0 −1 −1) facets had a good surface morphology. However, the backside of the crystal, with a nominal orientation of (3 0 −3 1}, had a surface morphology that was rough and irregular. The (3 0 −3 −1) side of the crystal was very similar in appearance to that of the (2 0 −2 −1) crystal except for different relative areas of the m-plane and (1 0 −1 −1) facets. This similarity is consistent with the almost −5-degree difference in tilt angle toward [0 0 0 1] between the two orientations and indicates that bi-faceted growth proceeds smoothly for a range of miscuts along [0 0 0 1] as long as the a-miscut angle is small, for example, less than about 1 degree.

Example 6

A bulk GaN crystal grown by HVPE, approximately 0.3 millimeter thick, was provided for use as a seed crystal for ammonothermal growth. The seed crystal had a large-area surface that was miscut from the (2 0 −2 −1) plane by approximately 0.05 degree toward [−12-10] and by approximately 0.12 degree toward [0001]. The (2 0 −2 −1) surface was laser-scribed with three parallel, 100 micron deep, 50 micron wide trenches along the a-direction of the seed, spaced approximately 1 millimeter apart. The seed crystal was placed inside a silver capsule along with a 33%-open-area baffle, approximately 49.0 grams of polycrystalline GaN nutrient, 2.6 grams of NH$_4$F mineralizer, and 30.0 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The crystal, which grew to a thickness of about 1.5 millimeter, was then examined under a microscope.

The large area surface on the seed crystal that was originally (2 0 −2 −1)-oriented formed several m-plane and (1 0 −1 −1) facets. The outermost facets, m-plane on one side and (1 0 −1 −1) on the other, were similar in appearance to those shown in FIG. 3 and described in Examples 4 and 5. Each of these two major facets appeared to have overgrown the outermost of the laser-scribed trenches on each side. However, between the two major facets, m-plane on one side and (1 0 −1 −1) on the other, were two additional facets, one (1 0 −1 −1) and the other m-plane, centered over the original central laser-scribed trench which was now grown over. In cross-section, the crystal surface was similar to one-half of FIG. 6B with, in sequence, an m-plane facet, a (1 0 −1 −1) facet, a second m-plane facet, and a second (1 0 −1 −1) facet. Both the m-plane and (1 0 −1 −1) facets had a good surface morphology. The backside of the crystal, with a nominal orientation of (2 0 −2 1), had a surface morphology that was rough and irregular.

Based on the SIMS results described in Example 5, we expect that the impurity distributions of H, O, and F of the originally (2 0 −2 −1)-oriented surface along a line perpendicular to the [−12 −10] direction of the trench would comprise four bands of alternating higher and lower impurity concentrations of the impurities, where the higher impurity concentration was higher between about 1.15 times and about 4 times the lower impurity concentration. We further expect that the impurity distributions will remain the same after planarization to form a (2 0 −2 −1) surface. With more and more-widely separated laser-scribed trenches, similarly-prepared crystals would have eight, 16, 32, or more bands of alternating higher and lower impurity concentrations and would be suitable to cost-effective manufacturing of semi-polar gallium nitride wafers.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A crystalline substrate comprising:
at least one planar surface angled by at least about 5 degrees from an m-plane and a c-plane of said crystalline substrate; and
alternating first and second bands laterally disposed on said planar surface, said first band comprising a first impurity concentration, said second band comprising a second impurity concentration, wherein said first impurity concentration is higher than said second concentration.

2. The substrate of claim 1, wherein said planar surface has a semipolar orientation within about 3 degrees of one of {6 0 −6 −1}, {5 0 −5 −1}, {4 0 −4 −1}, {3 0 −3 −1}, {5 0 −5 −2}, {2 0 −2 −1}, {3 0 −3 −2}, {4 0 −4 −3}, and {5 0 −5 −4}.

3. The substrate of claim 1, wherein the length of said planar surface is greater than about 25 millimeters.

4. The substrate of claim 1, wherein said planar surface has a dislocation density below about $10^7$ cm$^{-2}$.

5. The substrate of claim 4, wherein said dislocation density is below about $10^6$ cm$^{-2}$.

6. The substrate of claim 5, wherein said dislocation density is below about $10^5$ cm$^{-2}$.

7. The substrate of claim 6, wherein said dislocation density is below about $10^4$ cm$^{-2}$.

8. The substrate of claim 1, wherein the crystallographic orientation of said planar surface has a full width at half maximum of a symmetric x-ray rocking curve less than about 150 arc seconds.

9. The substrate of claim 8, wherein said full width at half maximum of a symmetric x-ray rocking curve is less than about 100 arc seconds.

10. The substrate of claim 1, wherein the crystalline substrate has a substantially wurtzite structure, and is substantially free of other crystal structures, wherein the other structures are less than about 1% in volume with respect to a volume of the substantially wurtzite structure.

11. The substrate of claim 1, wherein the crystallographic orientation of said planar surface has a full width at half maximum of a lowest-order asymmetric x-ray rocking curve less than about 150 arc seconds.

12. The substrate of claim 11, wherein said full width at half maximum of a lowest-order asymmetric x-ray rocking curve is less than about 100 arc seconds.

13. The substrate of claim 1, wherein said first and second bands have a period between about 0.01 mm and about 100 mm.

14. The substrate of claim 13, wherein said period is between about 1 mm and about 10 mm.

15. The substrate of claim 1, wherein the ratio of said first and second concentrations is less than 40.

16. The substrate off claim 15, wherein said ratio of said first and second impurity concentrations is less than 10.

17. The substrate of claim 1, wherein said alternating first and second bands comprise at least 4 of each of said first and second bands.

18. The substrate of claim 1, wherein said crystalline substrate comprises a gallium-containing nitride.

19. The substrate of claim 1, wherein said first and second impurity concentrations are greater than about $10^{16}$ cm$^{-3}$ of at least one impurity selected from O, H, Li, Na, K, F, Cl, Br, I, Si, Ge, Cu, Mn, and Fe.

20. The substrate of claim 19, wherein the at least one impurity is selected from O and H, and the distribution comprises at least 8 of each of said first and second bands, wherein said ratio of said first and second impurity concentrations is less than about 2.

21. The substrate of claim 1, wherein each of said first and second bands comprise a plurality of impurities constituting said first and second impurity concentrations.

* * * * *

UNITED STATES PATENT AND TRADEMARK OFFICE
CERTIFICATE OF CORRECTION

PATENT NO. : 10,145,026 B2
APPLICATION NO. : 13/908836
DATED : December 4, 2018
INVENTOR(S) : Mark P. D'Evelyn et al.

Page 1 of 1

It is certified that error appears in the above-identified patent and that said Letters Patent is hereby corrected as shown below:

In the Claims

Column 36 Lines 39-41:
In Claim 2, replace "{6 0 -6 -1}, {5 0 -5 -1}, {4 0 -4 -1}, {3 0 -3 -1}, {5 0 -5 -2}, {2 0 -2 -1}, {3 0 -3 -2}, {4 0 -4 -3}, and {5 0 -5 -4}" with "{6 0 -6 ±1}, {5 0 -5 ±1}, {4 0 -4 ±1}, {3 0 -3 ±1}, {5 0 -5 ±2}, {2 0 -2 ±1}, {3 0 -3 ±2}, {4 0 -4 ±3}, and {5 0 -5 ±4}."

Signed and Sealed this
Fourteenth Day of May, 2019

Andrei Iancu
*Director of the United States Patent and Trademark Office*